(12) United States Patent
Yoneda et al.

(10) Patent No.: US 7,616,355 B2
(45) Date of Patent: Nov. 10, 2009

(54) SOLID-STATE IMAGING DEVICE

(75) Inventors: Tomoya Yoneda, Chiba-ken (JP);
 Shigetoshi Sugawa, Kanagawa-ken (JP);
 Toru Koizumi, Kanagawa-ken (JP);
 Tetsunobu Kochi, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 784 days.

(21) Appl. No.: 11/104,538

(22) Filed: Apr. 13, 2005

(65) Prior Publication Data

US 2005/0185074 A1  Aug. 25, 2005

Related U.S. Application Data

(62) Division of application No. 09/727,486, filed on Dec. 4, 2000, now Pat. No. 7,016,089.

(30) Foreign Application Priority Data

Dec. 6, 1999  (JP)  ............... 11-346255
Nov. 30, 2000  (JP)  ............... 2000-365552

(51) Int. Cl.
 *H04N 1/04* (2006.01)
(52) U.S. Cl. ............... 358/482; 358/496; 358/471; 358/472
(58) Field of Classification Search ............... 358/482, 358/496, 471, 472, 473, 474, 513, 426.1, 358/514, 505; 250/214.1, 208.1; 257/292, 257/293, 294, 443, 444; 349/105, 106; 348/308, 348/309, 310
See application file for complete search history.

(56) References Cited

U.S. PATENT DOCUMENTS

| | | | |
|---|---|---|---|
| 4,148,048 A | 4/1979 | Takemoto et al. | 357/30 |
| 4,149,192 A * | 4/1979 | Takeuchi | 358/426.1 |
| 4,565,756 A | 1/1986 | Needs et al. | 430/7 |
| 4,652,899 A | 3/1987 | Hoeberechts | 357/29 |
| 4,751,559 A | 6/1988 | Sugawa et al. | 357/30 |
| 4,791,493 A | 12/1988 | Ogura et al. | 358/294 |
| 4,810,896 A | 3/1989 | Tanaka et al. | 250/578 |
| 4,814,846 A | 3/1989 | Matsumoto et al. | 357/30 |
| 4,866,293 A | 9/1989 | Nakamura et al. | 250/578 |
| 4,920,431 A | 4/1990 | Ogura et al. | 358/496 |
| 4,926,058 A | 5/1990 | Iwamoto et al. | 250/578.1 |
| 4,962,412 A | 10/1990 | Shinohara et al. | 357/30 |
| 4,996,606 A | 2/1991 | Kawai et al. | 3/475 |
| 5,196,691 A | 3/1993 | Kitani et al. | 2/208.1 |
| 5,268,309 A | 12/1993 | Mizutani et al. | 437/3 |
| 5,283,428 A | 2/1994 | Morishita et al. | 250/214.1 |

(Continued)

FOREIGN PATENT DOCUMENTS

EP  0 917 358  5/1999

(Continued)

*Primary Examiner*—Houshang Safaipour
(74) *Attorney, Agent, or Firm*—Fitzpatrick, Cella, Harper & Scinto

(57) ABSTRACT

To control the potential distribution generated in a well at the time of amplification and reduce a shading in a solid-state imaging device of amplification type, the amplification type solid-state imaging device of the present invention comprises a plurality of picture elements each including photoelectric conversion elements formed in a second conductivity type common well inside a first conductivity type substrate, wherein a plurality of well contacts are disposed inside a picture element array area.

4 Claims, 18 Drawing Sheets

U.S. PATENT DOCUMENTS

| | | | |
|---|---|---|---|
| 5,309,013 A | 5/1994 | Suzuki et al. | 257/446 |
| 5,352,883 A | 10/1994 | Kitani et al. | 2/208.1 |
| 5,453,611 A | 9/1995 | Oozu et al. | 250/208.1 |
| 5,519,247 A | 5/1996 | Arbus et al. | 257/437 |
| 5,526,141 A | 6/1996 | Ogura et al. | 3/496 |
| 5,587,611 A | 12/1996 | Botka et al. | 257/458 |
| 5,621,206 A | 4/1997 | Kitani et al. | 2/208.1 |
| 5,698,844 A | 12/1997 | Shinohara et al. | |
| 5,698,892 A | 12/1997 | Koizumi et al. | 257/620 |
| 5,723,877 A | 3/1998 | Sugawa et al. | 257/59 |
| 5,734,457 A * | 3/1998 | Mitsui et al. | 349/106 |
| 5,751,032 A | 5/1998 | Yu | 257/233 |
| 5,786,588 A | 7/1998 | Takahashi | 250/208.1 |
| 5,796,153 A | 8/1998 | Marcovici | 257/446 |
| 5,801,373 A | 9/1998 | Oozu et al. | 250/208.1 |
| 5,900,622 A | 5/1999 | Ogura et al. | 250/208.1 |
| 5,955,753 A | 9/1999 | Takahashi | 257/292 |
| 6,015,200 A | 1/2000 | Ogura | 347/3 |
| 6,035,013 A | 3/2000 | Orava et al. | 378/37 |
| 6,051,857 A * | 4/2000 | Miida | 257/292 |
| 6,097,432 A * | 8/2000 | Mead et al. | 257/292 |
| 6,127,692 A | 10/2000 | Sugawa et al. | 257/30 |
| 6,147,338 A | 11/2000 | Takahashi | 250/208.1 |
| 6,150,704 A | 11/2000 | Kozuka | 2/434 |
| 6,169,317 B1 | 1/2001 | Sawada et al. | 2/435 |
| 6,188,094 B1 | 2/2001 | Koichi et al. | 257/232 |
| 6,359,323 B1 | 3/2002 | Eom et al. | |
| 6,670,990 B1 | 12/2003 | Kochi et al. | 348/310 |
| 2002/0020845 A1 | 2/2002 | Ogura et al. | 257/88 |

FOREIGN PATENT DOCUMENTS

| | | | |
|---|---|---|---|
| JP | 58-137243 A | | 9/1982 |
| JP | 58-137243 | * | 8/1983 |
| JP | 62011264 A | | 7/1985 |
| JP | 62-206878 | | 9/1987 |
| JP | 2-34964 | | 2/1990 |
| JP | 2-34964 A | | 2/1990 |
| JP | 4-212459 A | | 8/1992 |
| JP | 11-252464 A | | 9/1999 |
| WO | WO 89/05042-89 | | 6/1989 |

* cited by examiner

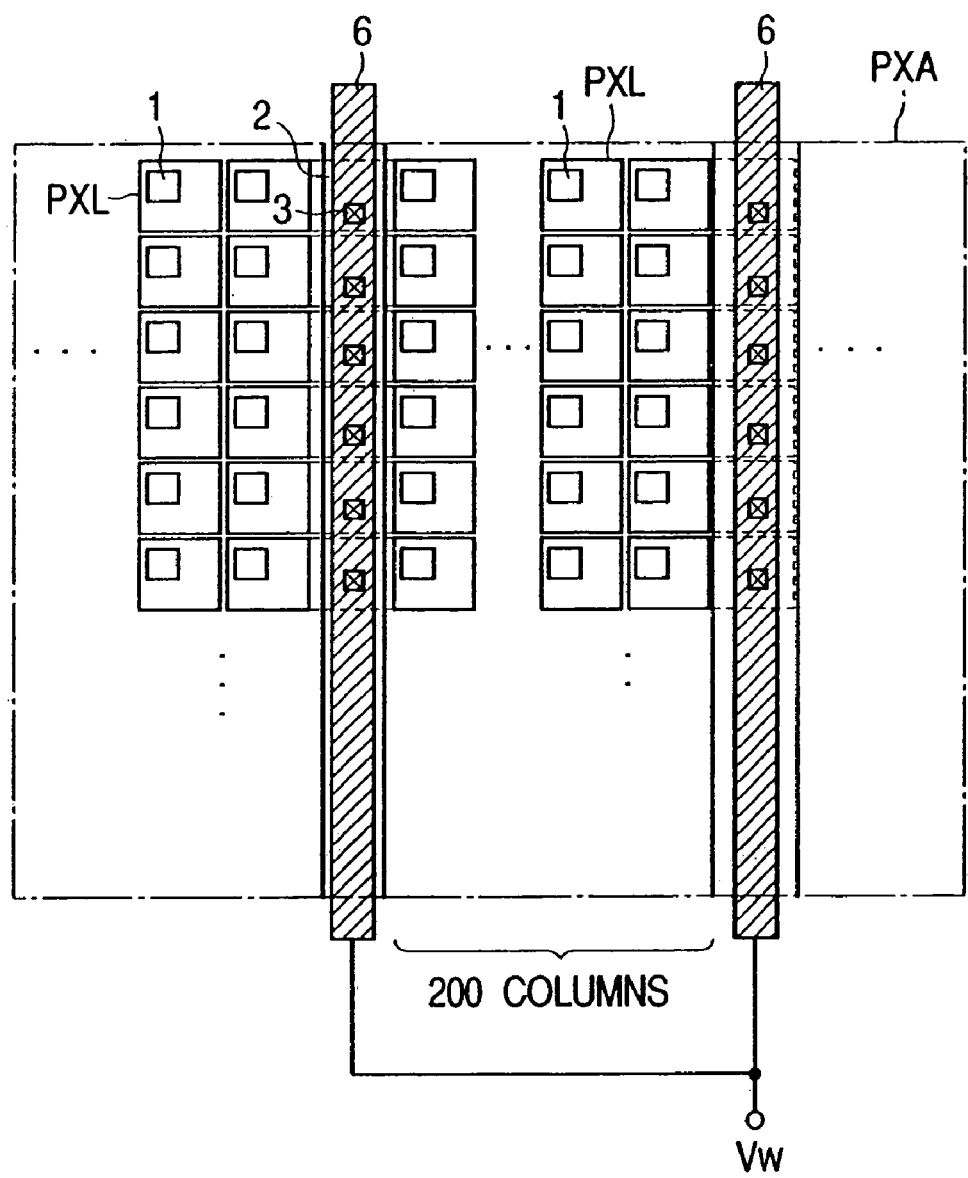

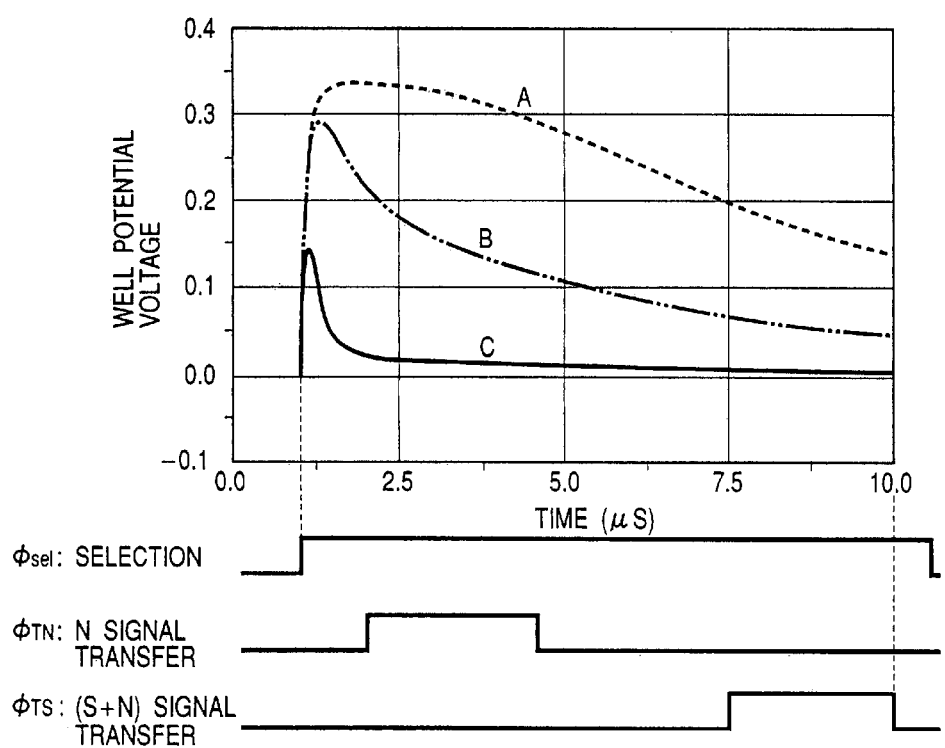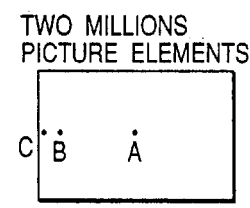
FIG. 19A
FIG. 19B

SOLID-STATE IMAGING DEVICE

This application is a division of U.S. application Ser. No. 09/727,486, filed Dec. 4, 2000, the entire content of which is hereby incorporated herein by reference.

BACKGROUND OF THE INVENTION

1. Field of the Invention

The present invention relates to a solid-state imaging device of an amplification type, in which a signal generated in each picture element by photoelectric conversion is amplified in each picture element.

2. Related Background Art

An amplification type solid-state imaging device using a MOS transistor has a circuit configuration shown in FIG. 16.

One picture element (PXL) comprises a photodiode (photoelectric conversion element) 101, a transfer switch 102, a reset switch (transistor for reset) 103, a selection switch (transistor for selection) 104 and an amplification transistor (transistor for amplification) 105.

Each picture element (PXL) is connected to a vertical output line 106.

Such picture elements (PXL) are two-dimensionally arranged on one and same flat surface and constitute a picture element array area (PXA).

A constant current source 107 connected to the vertical output line 106 of each column is connected so as to make the MOS transistor 105 operated as a source follower.

Also, a readout circuit is connected to each vertical output line 106 of each column.

The readout circuit, as described later, is separated into two systems: a readout system for reading out a noise signal including the noise generated therein (hereinafter referred to as "N signal") and a readout system for reading out a signal obtained by adding an optical signal and N signal (hereinafter referred to as "(S+N) signal"). Each readout system has either an N signal transfer switch 110 and an N signal storage capacity 112 or a (S+N) signal transfer switch 111 and a (S+N) signal storage capacity 113.

Moreover, the two readout systems are connected respectively to input lines 116 and 117 of a differential amplifier 115 via a switch 114 for horizontal scanning.

Next, the outline of the operation of this device will be described with reference to a drive timing chart shown in FIG. 17.

A high level reset control pulse φrst which turns on the reset switch 103 of the picture element in a selected horizontal line is given.

Then, a high level selection control pulse φsel which turns off the reset switch 103 and turns on the selection transistor 104 is given.

In this manner, a high level N signal transfer pulse φtn which turns on the N signal transfer switch 110 is given in order to store the N signal outputted to the vertical output line 106 in the N signal storage capacity 112.

When a high level transfer control pulse φtx which turns on the transfer switch 102 of the picture element of the selected row is given and the optical signal stored in the photodiode 101 is inputted to a gate of the amplification transistor 105, an output signal corresponding to the optical signal is obtained from a source of the amplification transistor. In this state, even if the transfer control pulse φtx is reduced to a low level and the transfer switch 102 is turned off, the gate potential of the amplification transistor is kept at a value based on the optical signal.

In this state, a high level (S+N) signal transfer pulse φts which turns on the (S+N) signal transfer switch 111 is given in order to store the (S+N) signal outputted to the vertical output line 106 in the (S+N) signal storage capacity 113.

Then, by turning off the selection switch 104, the readout of the signals from each picture element of the selected row is completed.

The N signal held in the N signal storage capacity 112 contains a KTC noise at the time of a reset and a fixed pattern noise due to variations in a threshold value of the MOS transistor.

The (S+N) signal held by the (S+N) signal storage capacity is a signal due to photoelectric charge added with the reset signal containing the above-described noise.

In this manner, each switch is controlled according to the timing of FIG. 17, and after a signal of the picture element on one horizontal line is held by the above-described two storage capacities of each column, by turning on the switch 114 by a horizontal scanning circuit, the N signal and the (S+N) signal are read out to each input line of the differential amplifier 115. At this time, from the differential amplifier 115, the above-described noises contained in each signal are removed and the signal corresponding to the signal alone due to photoelectric charge is outputted as a sensor output.

In short, by sequentially turning on and off the switch 114 of each column by a horizontal scanning circuit, the signals of the picture elements on one horizontal line are outputted from the differential amplifier. In order to perform this for each horizontal line, every time a picture element row is selected by a vertical scanning circuit, each switch is controlled according to the timing of FIG. 17 and the row is sequentially scanned by the horizontal scanning circuit and this procedure is repeated.

In this manner, the signals of all the picture elements can be outputted from the differential amplifier 115.

In the conventional solid-state imaging device, as the number of picture elements becomes large, a large shading appears in the output signal.

SUMMARY OF THE INVENTION

An object of the present invention is to provide a solid-state imaging device capable of controlling a shading.

Another object of the present invention is to provide an amplification type solid-state imaging device in which a plurality of picture elements each including a photoelectric conversion element and a transistor for amplification are two-dimensionally arranged, characterized in that a semiconductor light-receiving region of a first conductivity type serving as each photoelectric conversion element is provided in a common well comprising a semiconductor of a second conductivity type formed in a semiconductor substrate of the first conductivity type, and a semiconductor region of the first conductivity type serving as a source and drain of each transistor for amplification is provided in the above-described common well, and a plurality of contacts for supplying a reference voltage to the above-described common well are provided inside a picture element array area of the above-described common well.

Still another object of the present invention is to provide a solid-state imaging device capable of controlling the shading and having a refined layout.

A further object of the present invention is to provide an amplification type solid-state imaging device in which a plurality of picture elements each including a photoelectric conversion element and a transistor for amplification are two-dimensionally arranged, characterized in that a semiconductor light-receiving region of a first conductivity type serving as each photoelectric conversion element is provided in the common well of a second conductivity type in a semiconductor substrate of the first conductivity type, contacts for supplying a reference voltage to the above-described common well are provided on the circumference of a picture element array area of the above-described common well and in each picture element, and a semiconductor region of the first conductivity type serving as the source or the drain of each transistor for amplification is provided inside the above-described common well, and a contact for a power source for supplying, to the semiconductor region, a power source voltage for driving the above-described transistor for amplification is provided for each picture element.

The present inventors seriously examined the cause of the shading becoming large in case of the number of picture elements being increased.

For example, in the case where the MOS transistor 105 as shown in FIG. 16 is a NMOS formed in a p well inside an n type substrate, its sectional structure can be configured as shown in FIG. 18. In this case, the source and the drain are n+ regions, and the drain is connected to the selection switch side and the source is connected to the vertical output line, while the potential of a p type well is given outside the picture element array area.

In the timing as shown in FIG. 17, when the selection switch 104 is turned on and the N signal is outputted to the vertical output line, the potential of the n+ source region of the MOS transistor 105 as shown in FIG. 18 fluctuates. Then, accompanied with this fluctuation, by junction capacitances of the n+ area and the p well, the potential of the p well in the vicinity of an n+ diffusion area of the source also fluctuates.

Also, since the p well potential of each picture element has become a potential of the back gate of the MOS transistor of each picture element, the fluctuation of the well potential has an effect on the output of the MOS transistor.

FIG. 19A is a graph showing well potentials measured before and after the above fluctuation is effected at the positions of three points A, B and C (see FIG. 19B) inside the picture element area with two millions of picture elements. The axis of ordinates in the graph shows a well potential, and the axis of abscissas shows a time. The graph shows a state that, when the selection switch 104 is turned on, the well potential rises, reaches a peak and thereafter converges.

The fluctuating amount of the well potential becomes larger as a measurement position moves to the center (C→A) inside the picture element area. With regard to transient characteristics of the well potential, a time constant also becomes larger as a measurement position moves to the center (C→A) inside the picture element area, which is about 15 µs at the position of A.

That is, when the N signal transfer switch 110 is turned on before the well potential is not returned after the selection switch 104 is turned on, depending on the position of the picture element, signals of different levels are held in each N signal storage capacity 112 in spite of the fact that the gate voltage of the MOS transistor is the same reset voltage for each picture element.

Also, in the subsequent timing, even when the (S+N) signal transfer switch 111 is turned on, depending on the position of the picture element, the signal corresponding to the well potential at that position is held in the (S+N) signal storage capacity 113. Moreover, the well potential of even the same picture element fluctuates depending on the time from when the N signal transfer switch is turned on to when the (S+N) signal transfer switch 111 is turned on, and therefore this becomes the cause of the shading in image operation.

FIG. 20 shows the sensor output at the dark time from the picture elements on one horizontal line passing through the center of the picture element array area is shown, wherein the axis of abscissas corresponds to the horizontal position of the picture element, and the axis of ordinates corresponds to the output level. FIG. 20 shows the case where it took 10 µs time until the (S+N) signal transfer switch was turned off after the selection switch was turned on and the shading of no less than 76 mV is produced.

FIG. 21 shows the area dependency of a picture element array area on a time constant. With the area of one picture element taken as fixed, the number of picture elements in a horizontal direction corresponding to the size of the picture element array area is shown in the axis of abscissas in FIG. 21, and the time constant of the well potential at the center of the picture element array area is shown in the axis of ordinates.

When a signal is read out from the picture element of one horizontal line, the time till the (S+N) signal transfer switch is turned off after the selection switch is turned on can not be made long limitlessly due to relevant imaging time of the picture element of the solid-state imaging device.

Hence, when this time is made not more than 10 µs, the shading does not cause a problem if the number of picture elements in a horizontal direction is up to about 800 and the time constant ranges to 2 µs.

However, in case of the solid-state imaging device with a large area where the number of picture elements is, for example, nearly 2000, the shading of 78 mV is caused as described above.

The present inventors have already found that, even if a sheet resistance of the well is reduced to one fifth so as to reinforce the well potential just simply by making the well concentration larger, the number of the picture elements in a horizontal direction is limited upto about 2000 so that the shading is not caused produced, and this neither solves the substantial problem nor allows each element such as MOS transistor to operate normally.

Therefore, in the present invention, a plurality of well contacts are newly provided in a side inner than the outer periphery of the common well and inside the picture element array area so that the fluctuation of the well potential and the non-uniformity of the well potential for each picture element are controlled, thereby making it possible to inhibit the fluctuating amount of the well potential accompanied by the fluctuation of the source potential of the MOS transistor inside each picture element.

As a result, the well potential converges within a short time even after the fluctuation and the transient characteristics are improved. Thus, the distribution of the well potential inside the picture element area can be controlled to thereby reduce the shading.

BRIEF DESCRIPTION OF THE DRAWINGS

FIG. 5 is a schematically plan view of the solid-state imaging device according to the fifth embodiment of the present invention;

FIGS. 19A and 19B are graphs showing a change in the well potential of the solid-state imaging device;

DETAILED DESCRIPTION OF THE PREFERRED EMBODIMENTS

First Embodiment

Figure 1A:
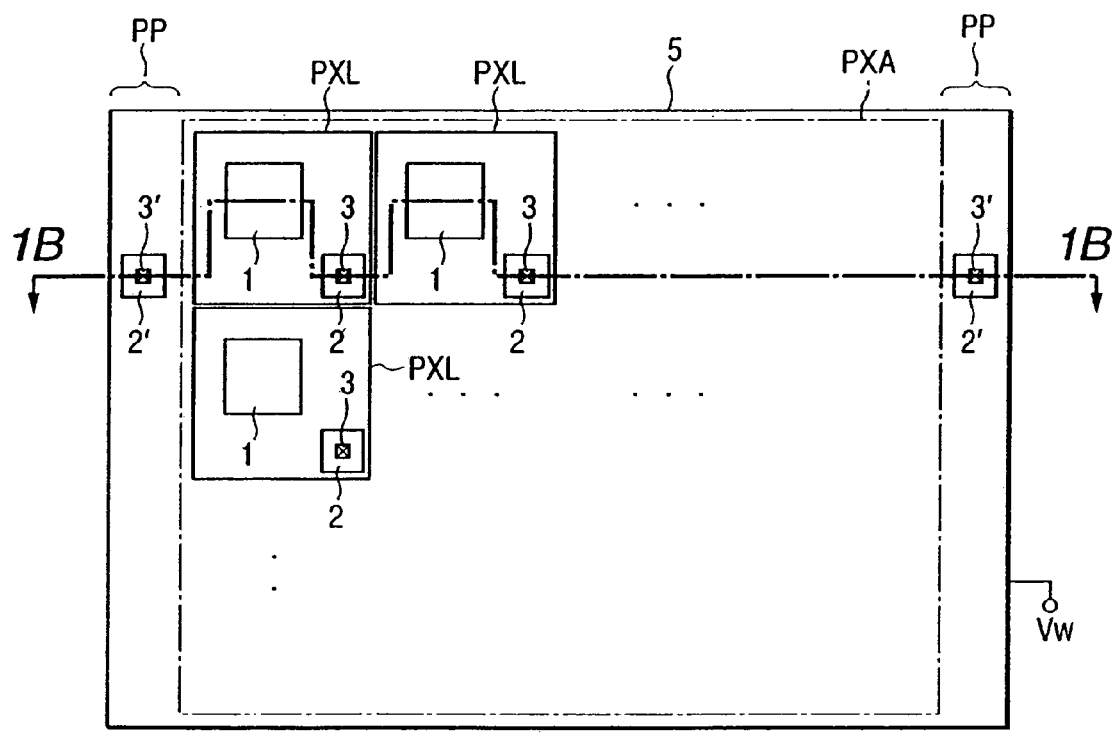
FIG. 1A is a schematically plan view of a solid-state imaging device according to the first embodiment of the present invention.

FIG. 1A is a schematically plan view of a solid-state imaging device according to the first embodiment of the present invention.

Here, in the picture element array area, only three picture elements PXLs are shown, but actually there are arranged approximately 1 millions to 10 millions of these picture elements PXL in a matrix state.

Figure 1B:
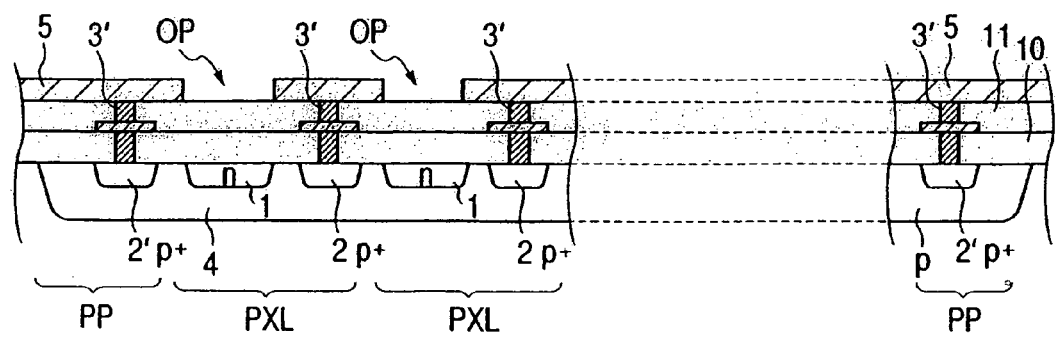
FIG. 1B is a schematically sectional view taken along the line 1B-1B of FIG. 1A.

FIG. 1B shows a sectional view taken along the line 1B-1B of FIG. 1A. In FIG. 1B, a variety of wiring layers and transistors and the like in a portion below a well wiring are omitted.

Reference numeral 1 denotes a photodiode as a photoelectric conversion element and is, to be more exact, an N type semiconductor light-receiving region (area) constituting a photodiode in cooperation with a well. Reference numeral 2 denotes a doped area (P+ region) having an impurity concentration higher than that of the well, and the same conductivity type as of a P type well. Reference numeral 3 denotes a well contact which comprises a conductive member directly or indirectly contacting the doped area 2.

All of the picture elements PXLs are two-dimensionally arranged in the inner side than the outer periphery of a single common well 4, that is, within the picture element array area PXA.

Reference numeral 5 denotes a well wiring also serving as a shielding layer which comprises a conductive member where a light-receiving window OP is formed through which the photodiode 1 is irradiated with a light. This well wiring 5 is connected to the well contact 3 and given a predetermined reference voltage (for example, 0 V) from a reference voltage source Vw.

In FIG. 1B, the well contact is formed by a wiring layer disposed between an insulating layer 10 and an insulating layer 11; a conductive plug inside a through hole on the upper part of the wiring layers; and a conductive plug inside the contact hole on the lower part of the wiring layers. However, the present invention is not restricted to this configuration.

Here, a structural feature is that the well contact 3 is provided for each picture element with one to one correspondence in all the picture elements and the outermost conductive layer serving as the shielding layer also functions as the well wiring 5.

Also in a vicinity PP of the picture element array area PXA, a doped area 2' and a contact 3' are disposed. That is, the doped area 2' is disposed inside the common well 4 outside the periphery of the picture element array area PXA, and the contact area 3' is disposed on the doped area 2' and connected to the well wiring 5 so that the predetermined reference voltage is applied thereto. In FIGS. 1A and 1B, a variety of wiring layers and transistors and the like in a portion below the well wiring 5 is omitted.

Figure 1C:
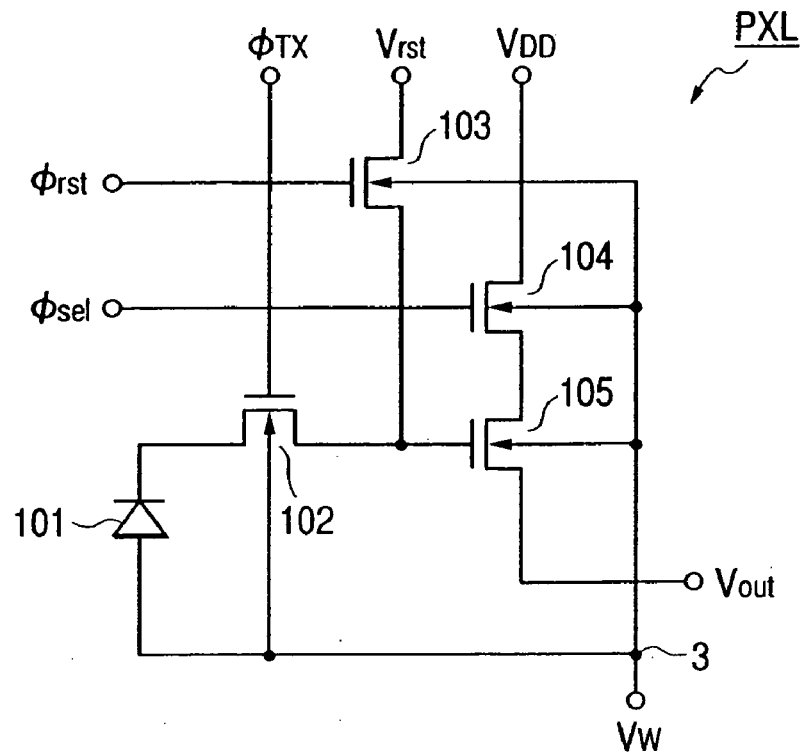
FIG. 1C is a circuit block diagram of one picture element of the solid-state imaging device used in the present invention.
Figure 1D:
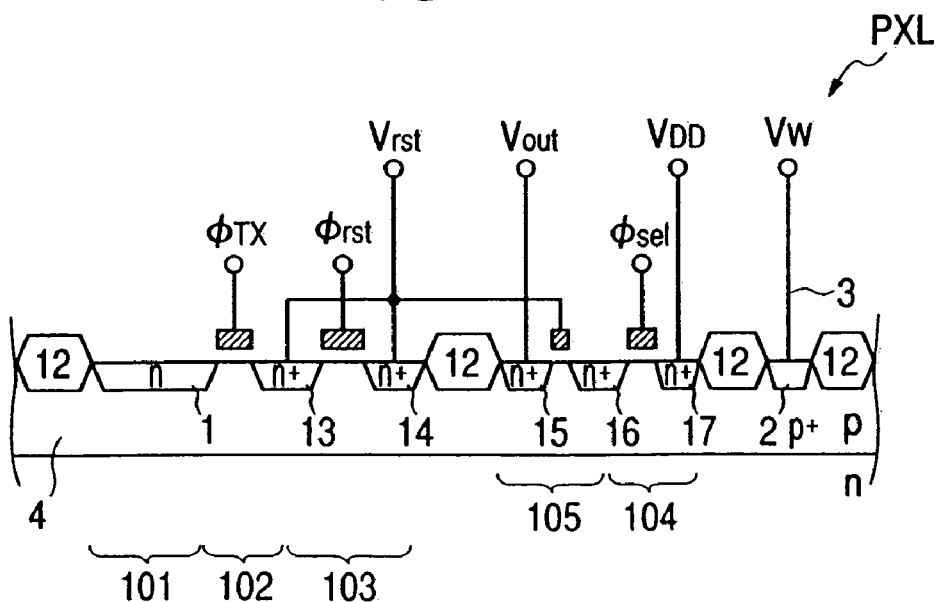
FIG. 1D is a schematically sectional view of one picture element of the solid-state imaging device used in the present invention.

FIGS. 1C and 1D show a circuit diagram of one picture element used in the present invention and its sectional structure.

One picture element PXL comprises: a photodiode 101; a transfer switch 102; a transistor for amplification (amplification transistor) 105; a transistor for selection (selection transistor) 104; and a transistor for reset (reset transistor) 103.

Reference numeral 12 denotes an element separating region (area) area comprising an insulating member (dielectric member) and surrounds the periphery of one picture element. The element separating area is also formed between a region including the photodiode 101, the transfer switch 102 and the reset transistor 103 and the region including the selection transistor 104 and the amplification transistor 105 and in the periphery of the doped area 2.

N type semiconductor region (areas) 1 and 13 to 17 serving as the cathode of the photodiode 101 and the source and drain of each transistor (semiconductor element) are formed inside the P type common well 4 which is formed on the surface of an N type substrate. A P+ doped layer 2 and a contact 3 are disposed in the P type common well 4, and an anode voltage of the photodiode and a back gate voltage (channel voltage) of each transistor are given from the reference voltage source Vw.

By applying a transfer control signal φtx to a transfer gate control line for controlling a transfer gate, the gate is opened. By so doing, a carrier (electron) stored in the semiconductor light-receiving area 1 of the photodiode 101 is transferred to the semiconductor area 13 in a floating state, thereby changing the gate potential of the amplification transistor 105.

By applying a selection control signal φsel to a selection switch line, the selection transistor 104 is turned on. By so doing, a current corresponding to the voltage of the amplification transistor 105 flows to the amplification transistor 105 and the selection transistor 104, thereby enabling to take out an output signal from a output line Vout.

By applying a reset control signal φrst to a reset control line, the reset transistor 103 is turned on, and by using a reset voltage Vrst, a potential of the semiconductor area 13 is reset to a predetermined value.

During a series of such operations, the common well 4 is given a reference voltage through the contact 3 and the doped area 2.

By the above-described configuration, the non-uniform of the well potential (back gate potential of each transistor) for each picture element is reduced and the shading can be brought down to not more than 0.5 mV.

In this embodiment as described above, the conductivity type of the common well was a P type. However, it is possible to reverse the conductivity type of each semiconductor area as shown in the drawing (to change P to N and N to P). In this case, a rise and fall relation of the potential is also reversed. For example, in case of using the N type well, the reference voltage given to the well becomes +5.0 V or +3.3 V.

Also, the circuit structure of the picture element is not necessarily the same as that shown in FIG. 1C and it is possible to omit the transfer switch 102 and the like.

Moreover, the reset voltage Vrst may be made same as a power source voltage VDD.

Second Embodiment

Figure 2A:
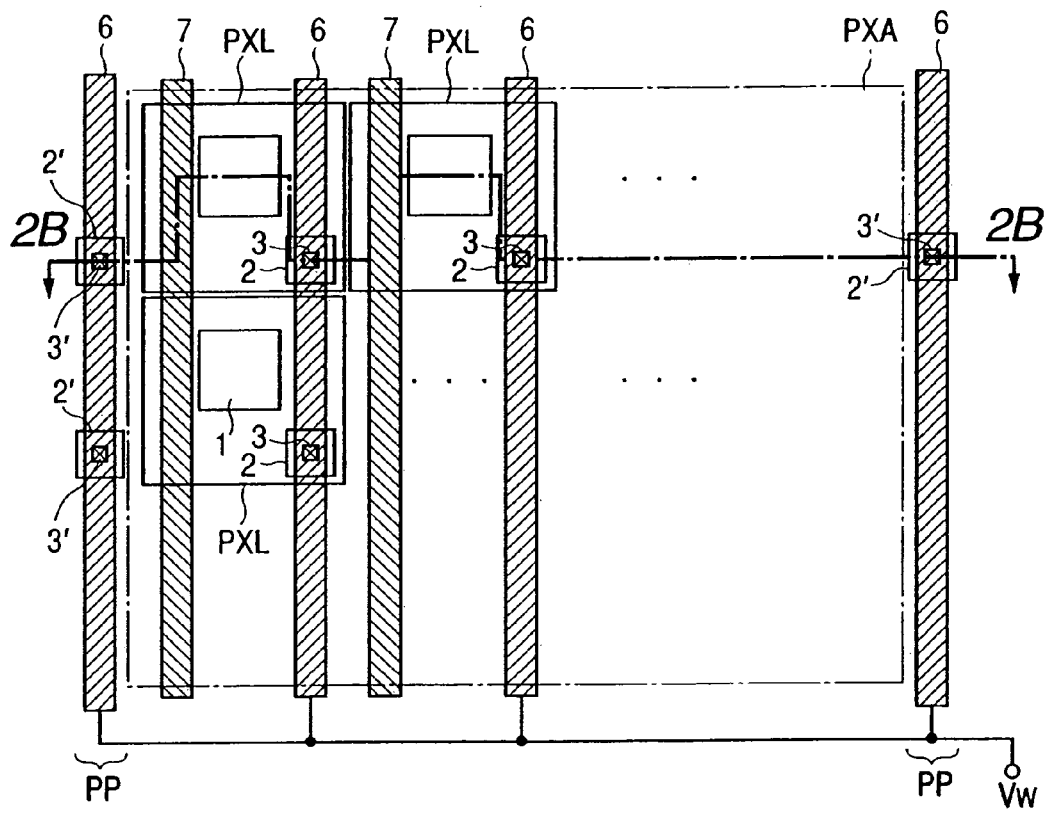
FIG. 2A is a schematically plan view of the solid-state imaging device according to the second embodiment of the present invention.

FIG. 2A is a plan view schematically showing the second embodiment of the present invention.

Figure 2B:
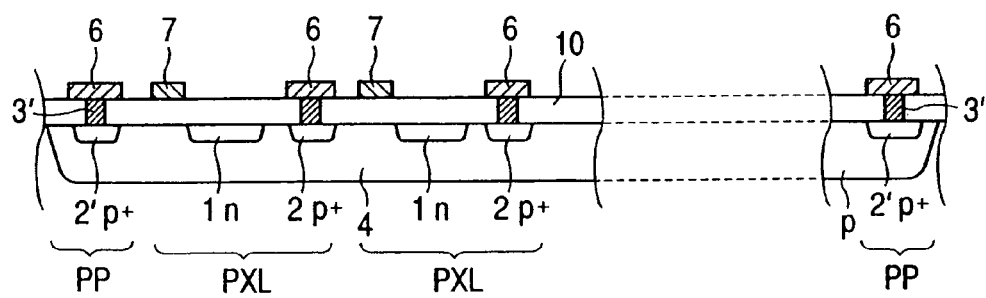
FIG. 2B is a schematically sectional view taken along the line 2B-2B of FIG. 2A.

FIG. 2B shows a sectional view taken along the line 2B-2B of FIG. 2A.

This embodiment is different from the embodiment of FIGS. 1A and 1B in the shape of the well wiring 6.

Here, the well wiring 6 is constructed by using the conductive layer under the shielding layer. Vertical output lines 7 for outputting a signal from the amplification transistor 105 through the conductive layer of the same level and the well wirings 6 are alternately arranged so that the vertical output lines 7 are in parallel with the well wiring 6.

Also, the well wiring 6, the well contact 3' and the doped area 2' are formed also in the vicinity PP of the picture element array area PXA and a predetermined reference voltage is given from the reference voltage source Vw through the well wiring 6.

In this embodiment also, the shading can be brought down to not more than 0.5 mV.

Also, between the vertical lines 7 of adjacent columns, the well wiring 6 with a fixed potential is provided, and therefore an interference due to capacity coupling between the adjacent vertical lines can be inhibited.

Third Embodiment

Figure 3:
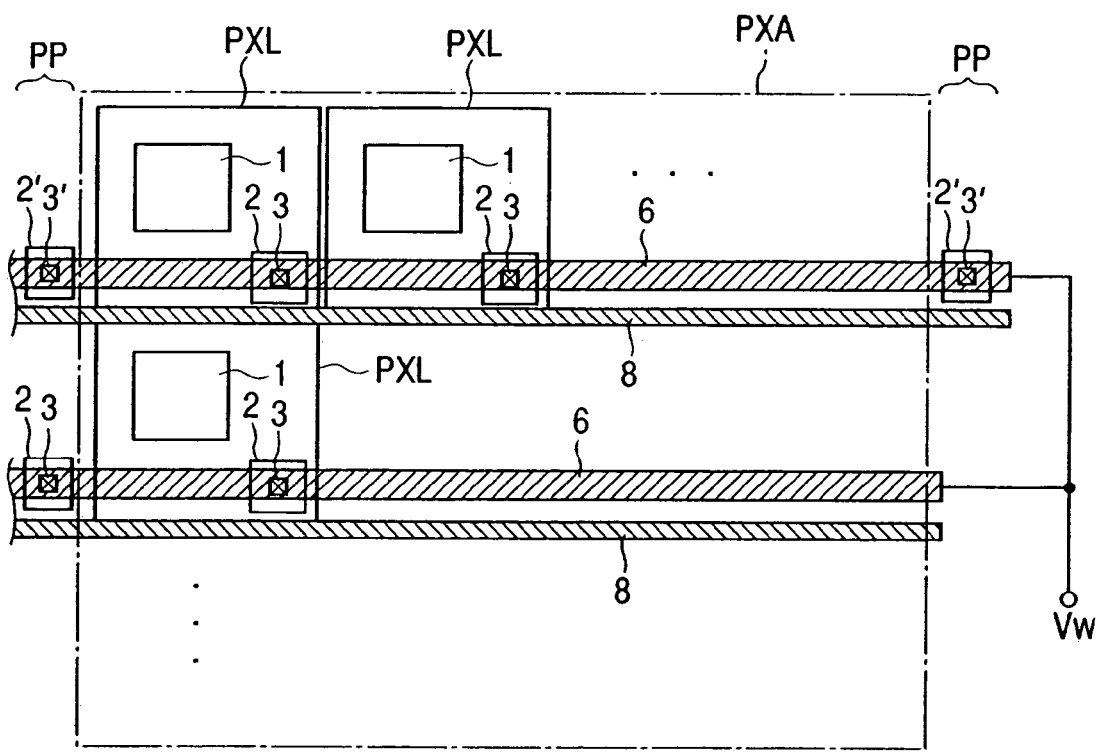
FIG. 3 is a schematically plan view of the solid-state imaging device according to the third embodiment of the present invention.

FIG. 3 is a plan view schematically showing the third embodiment of the present invention.

This embodiment is different from the embodiment shown in FIGS. 2A and 2B in the layout of the well wiring 6.

Here, the well wiring 6 is configured so as to extend in a row direction (laterally in the drawing) by using the conductive layer below the shielding layer. The control lines 8 for controlling the semiconductor element of the picture element by using the conductive layer of the same level and the well wirings 6 are alternately arranged so that the control lines 8 are in parallel with the well wirings 6 respectively. As for the control line 8, the transfer control line for the transfer switch, the reset control line for the reset transistor, the selection control line of the selection transistor and the like can be included.

Also in the vicinity PP of the picture element array area PXA, the doped area 2' and a well contact area 3' are formed so that a predetermined reference voltage is given from the reference voltage source through the well wiring 6.

In this embodiment, the well contacts are disposed around the picture element array area and in all the picture elements respectively, and the well wirings are disposed for all the rows of the picture element array. By so doing, the variation in the non-uniform distribution of the well potential is reduced and the shading can be brought down to 0.5 mV or less.

Fourth Embodiment

Figure 4A:
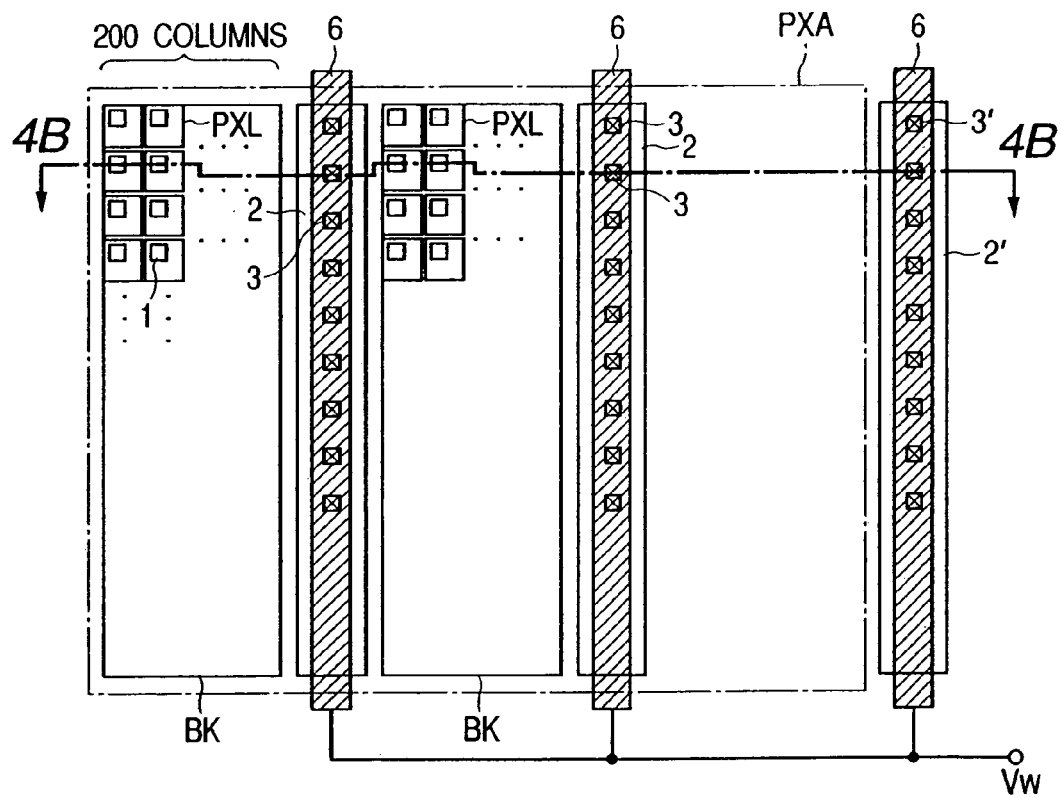
FIG. 4A is a schematically plan view of the solid-state imaging device according to the fourth embodiment of the present invention.

FIG. 4A is a plan view schematically showing the fourth embodiment of the present invention.

Figure 4B:
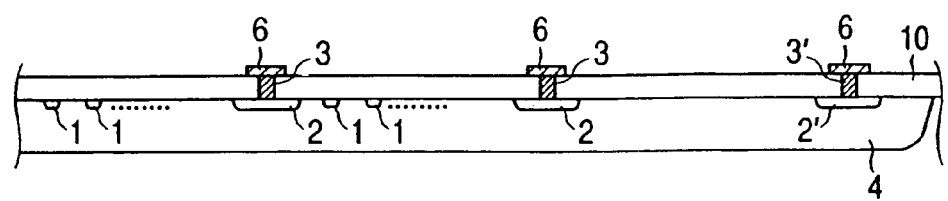
FIG. 4B is a schematically plan view taken along the line 4B-4B of FIG. 4A.

FIG. 4B shows a sectional view taken along the line 4B-4B of FIG. 4A.

Here, reference numeral 1 denotes a photodiode, reference numeral 2 a doped area, reference numeral 3 a well contact, reference numeral 4 a single common well two-dimensionally arranged, and reference numeral 6 a well wiring.

This embodiment is characterized in that the picture elements PXLs are divided, for example, into a blocks BKs each having 200 columns in a periodic pattern, and a space for the well contact is disposed between the blocks, and a plurality of the well contacts and the well wiring are provided for each space. By so doing, even if there is no space available for disposing the well contact inside each picture element by a reduction in the size of the picture element, the non-uniform distribution of the well potential can be reduced.

Also, the well contact 2' around the picture element array area PXA can be disposed either on the upper and lower extended line of the well wiring 6 or around the right and left picture element array areas similarly to the well wiring 6.

According to this embodiment, the shading can be brought down to 0.5 mV or less. Also, since a width of the space appearing every 200 columns was not more than one fourth of the size of the picture element, the effect on the image is to such an extent that it is not recognizable by a visual observation and, as a whole, an excellent image can be held.

Fifth Embodiment

FIG. 5 is a plan view schematically showing the fifth embodiment of the present invention. Here, reference numeral 1 denotes a photodiode, reference numeral 2 a doped area, reference numeral 3 a well contact, reference numeral 4 a single common well where the picture elements are two-dimensionally arranged, and reference numeral 6 a well wiring.

This embodiment is characterized in that the well contacts and the well wirings are disposed in the specific columns of the picture elements to be arranged, for example, in the 201st column, 402nd column and the like among the picture elements arranged in a periodic pattern. That is, in the picture elements of these picture element columns, neither photodiodes nor semiconductor elements are formed, but only the doped areas and the well contacts are formed. Alternatively, by making the photodiode and the semiconductor element smaller in size than those of other picture element, the doped area may be disposed in the space not occupied by the photodiode and the semiconductor element.

In this manner, even if there is no space available for disposing the well contact inside each picture element by a reduction in the size of the picture element, the non-uniform distribution of the well potential can be reduced without disturbing a pitch of picture elements inside the picture element area. By doing so, the shading can be brought down to 0.5 mV or less.

Also, since signals of all picture elements in one column where well contacts are disposed are not obtained, one linear scratch is made for every 200 columns. This is processed in software by a computer after a sensor signal is taken in as its location is known in advance at the time of design, and interpolated with average outputs of the picture elements at both sides of the picture element not provided with the well contact, whereby an excellent image is obtained. Incidentally, the method of interpolating the scratch is not restricted to the above, but which may be carried out by a circuit-wise average processing or by a processing other than the average processing.

Sixth Embodiment

Figure 6:
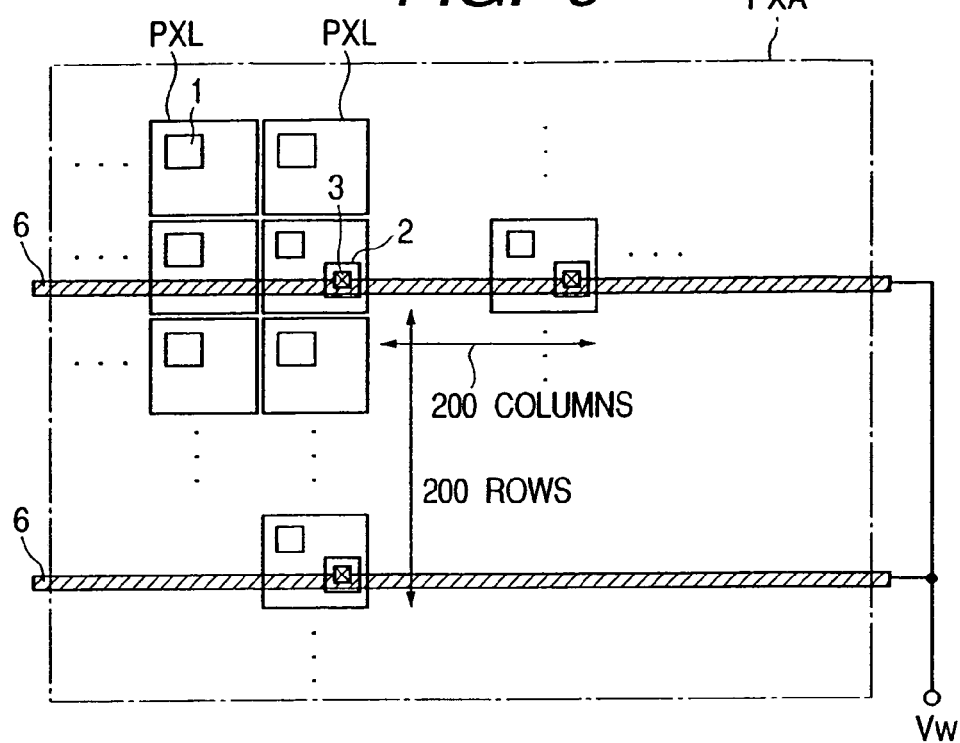
FIG. 6 is a schematically plan view of the solid-state imaging device according to the sixth embodiment of the present invention.

FIG. 6 is a plan view schematically showing the sixth embodiment of the present invention. Here, reference numeral 1 denotes a photodiode, reference numeral 2 a doped area, reference numeral 3 a well contact, reference numeral 4 a picture element array area inside a single well where the picture elements are two-dimensionally arranged, and reference numeral 6 a well wiring.

In this embodiment, the well wirings 6 and the well contacts 3 are disposed in the picture element array in a periodic pattern, for example, the well wirings 6 are disposed for every 200 rows and the well contacts 3 are disposed for very 200 columns of each row provided with the well wiring.

Since the picture element where the well contact 3 is disposed requires a space for the well contact, the area of the photodiode 1 inside the picture element in which the well contact is formed is made smaller than the area of the photodiode of the picture element in which no well contact is formed.

In this manner, even if it is difficult to provide a space for disposing the well contact inside each picture element by a reduction in the size of the picture element, the non-uniform distribution of the well potential can be inhibited without disturbing a pitch of picture elements in the picture element area. By doing so, the shading can be brought down to 0.5 mV or less.

Also, the picture element having a reduced area of the photodiode exhibits a slightly lowered sensitivity. However, at the time of design, since the location of this picture element is known in advance, it is processed in software by a computer after the sensor signal is taken in and corrected by applying a gain to this picture element, thereby obtaining an excellent image.

Seventh Embodiment

Figure 7:
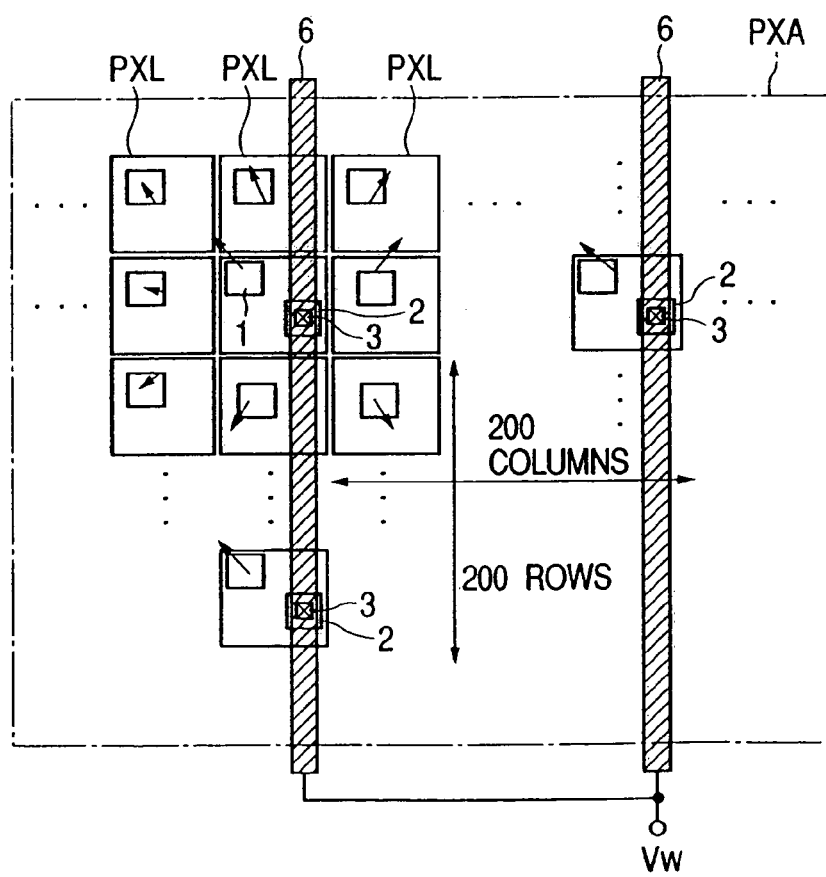
FIG. 7 is a schematically plan view of the solid-state imaging device according to the seventh embodiment of the present invention.

FIG. 7 is a top view schematically showing the seventh embodiment of the present invention. Here, reference numeral 1 denotes a photodiode, reference numeral 2 a doped area, reference numeral 3 a well contact, reference numeral 4 a single common well where the picture elements are two-dimensionally arranged, and reference numeral 6 a well wiring.

In this embodiment, the well wirings 6 and the well contacts 3 are disposed in the picture element array in a periodic pattern, for example, the well wirings 6 are disposed for every 200 columns and the well contacts 3 are disposed for every 200 rows of each column provided with the well wiring, and the photodiodes and another elements inside 9 picture elements which are the picture element provided the well contact and the adjacent picture elements are sifted in a radial direction away from the well contact, whereby a space for the well contact is provided. By doing so, the area of the photodiode of the picture element in which the well contact is disposed is not required to be reduced and, therefore, the non-uniform distribution of the well potential can be inhibited without lowering the sensitivity of the picture element provided with the well contact. In this manner, the shading can be brought down to 0.5 mV or less.

Eighth Embodiment

Figure 8:
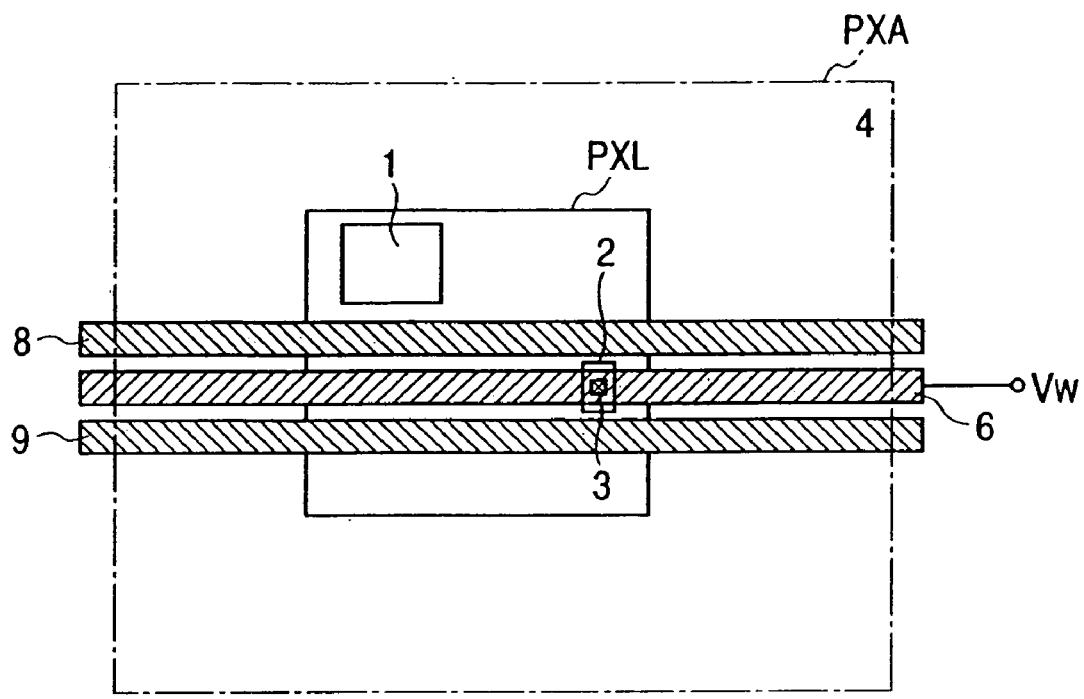
FIG. 8 is a schematically plan view of the solid-state imaging device according to the eighth embodiment of the present invention.

FIG. 8 is a plan view schematically showing the eighth embodiment of the present invention. Here, reference numeral 1 denotes a photodiode, reference numeral 2 a doped area, reference numeral 3 a well contact, reference numeral 4 a single common well where the picture elements are two-dimensionally arranged, reference numeral 6 a well wiring, and reference numerals 8 and 9 control lines for controlling a semiconductor element inside the picture element.

In this embodiment, the well contacts are disposed in all the picture elements and the well wirings 6 are disposed in all rows. The well wiring 6 is disposed between the control lines 8 and 9.

In this manner, the non-uniform distribution of the well potential can be inhibited, and therefore the shading can be brought down to 0.5 mV or less.

Also, as the effect of disposing the well wiring 6 between the two adjacent control lines 8 and 9, for example, there is no influence of clock noises on the control lines themselves such as the opening of the transfer switch by getting clock noises on the control line of the transfer switch.

The control lines 8 and 9 can be used by selecting two kinds from the transfer control line for the transfer switch, the reset control line for the reset transistor and the selection control line of the selection transistor.

Also, by modifying this embodiment, the well contacts may be disposed, instead of all picture elements, only in the specific picture elements two-dimensionally arranged at a predetermined cycle between which a plurality of picture elements are disposed, and then the well contacts may be connected to the well wirings 6.

Ninth Embodiment

Figure 9:
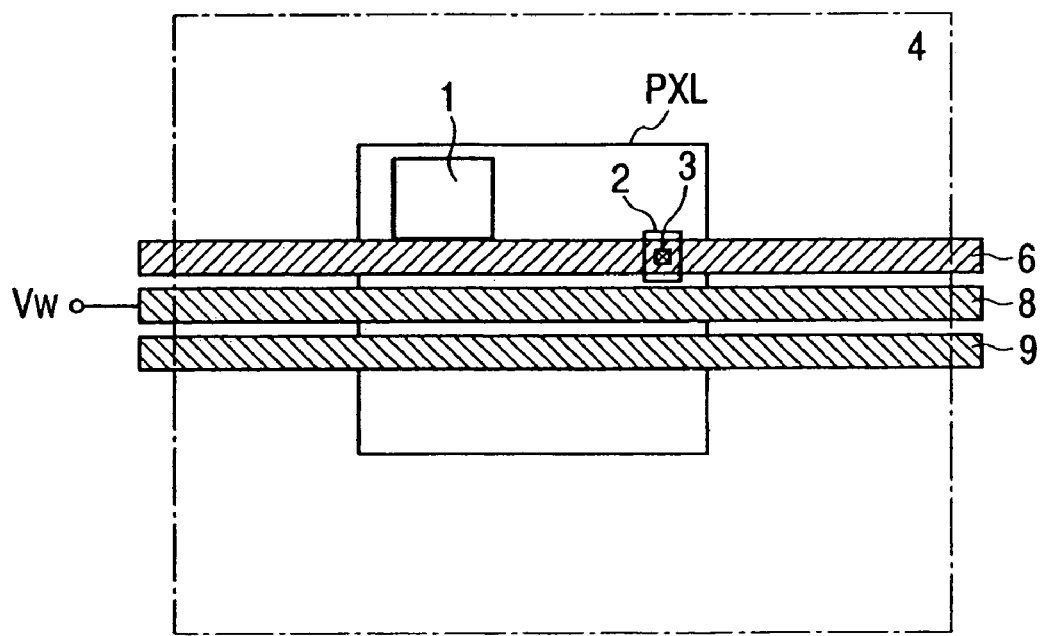
FIG. 9 is a schematically plan view of the solid-state imaging device according to the ninth embodiment of the present invention.

FIG. 9 is a plan view schematically showing the ninth embodiment of the present invention. Here, reference numeral 1 denotes a photodiode, reference numeral 2 a doped area, reference numeral 3 a well contact, reference numeral 4 a single common well where picture elements are two-dimensionally arranged, and reference numerals 8 and 9 control lines for controlling the elements inside the picture element.

In this embodiment, the well contacts are disposed in all picture elements and the well wirings are disposed in all rows. The well wiring 6 is disposed between the photodiode 1 and the control line 8.

In this manner, the non-uniform distribution of the well potential can be inhibited and the shading can be brought down to 0.5 mV or less.

Also, further two effects of this embodiment will be described.

Figure 10A:
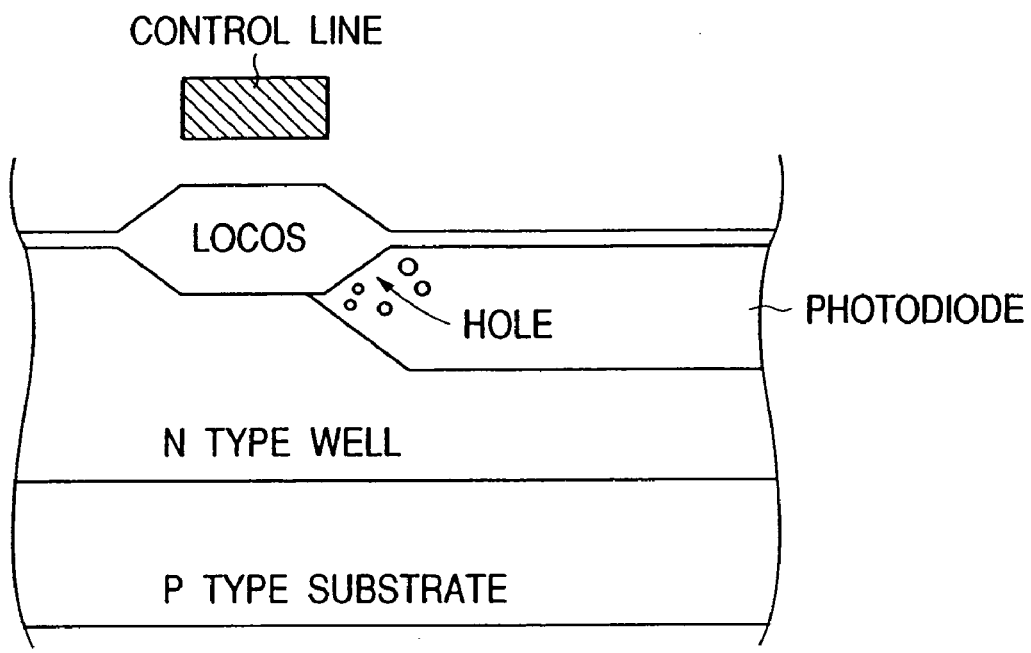
FIGS. 10A and 10B are schematically sectional views for explaining the operation of the solid-state imaging device according to the ninth embodiment of the present invention.
Figure 10B:
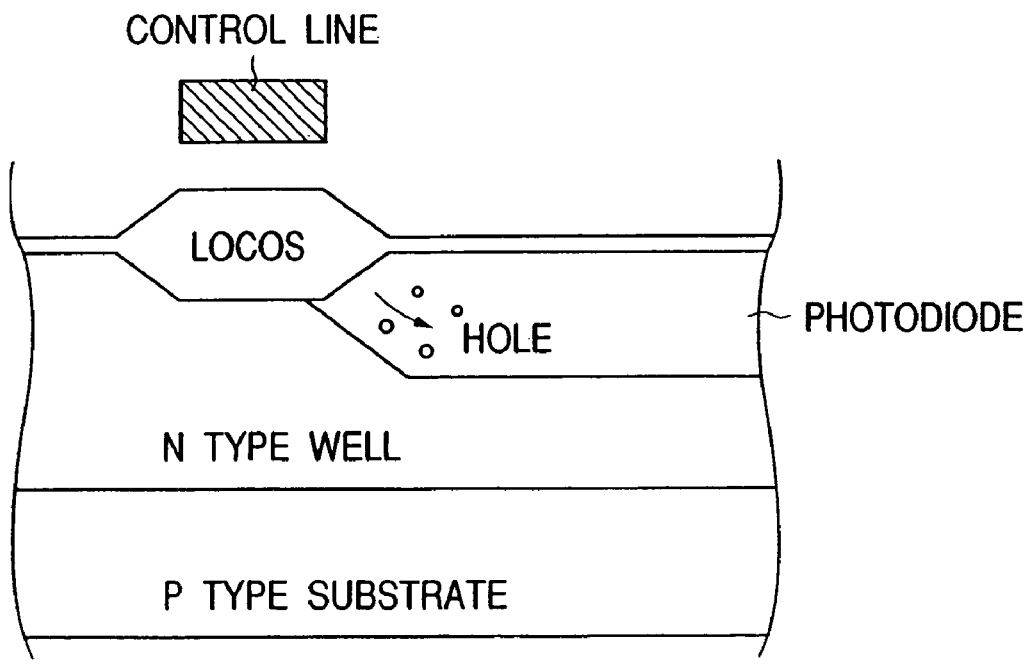

FIGS. 10A and 10B show schematically partial sections of the solid-state imaging device of this embodiment.

Here, in the case of the solid-state imaging device wherein the substrate is a P type, the well is an n type and the photodiode is a hole storage type, a structure is illustrated where the control line is adjacent to the photodiode.

The control lines 8 and 9 can be used by selecting two kinds from the transfer control line for the transfer switch, the reset control line for the reset transistor and the selection control line of the selection transistor.

The FIG. 10A is a view at the time when the control line is at 5V and shows a state where holes are gathering together as a potential adjacent to the control line inside the photodiode is lowered.

In contrast, FIG. 10B is a view at the time when the control line is at 0 V and shows a state where holes are running away as the potential adjacent to the control line inside the photodiode is raised.

That is, every time a clock enters the control line, holes inside the photodiode are swung around. Therefore, by a transfer timing by the transfer switch and a clock timing of the control line, a transfer remainder and the like occur, thereby causing a noise.

However, in this embodiment, by replacing the wiring adjacent to the photodiode with the well wiring and fixing it to the well potential, the above noise generated from the swinging around of the storage charge inside the photodiode can be inhibited.

Also, when the wiring adjacent to the photodiode is at 0 V, a depletion layer expands along the sidewalls of the photodiode and LOCOS, and a contact area between the LOCOS and the depletion layer becomes large. For this reason, due to defects of the LOCOS sidewall, a dark current increased. However, by replacing the wiring adjacent to the photodiode with the well wiring and fixing it to the well potential, the expansion of the above depletion layer can be inhibited so as to reduce the dark current.

In this embodiment, in all picture elements, or only in the specific picture elements two-dimensionally arranged at the predetermined cycle between which a plurality of picture elements are disposed, the well contacts are disposed and connected to the well wirings 6.

Tenth Embodiment

Figure 11:
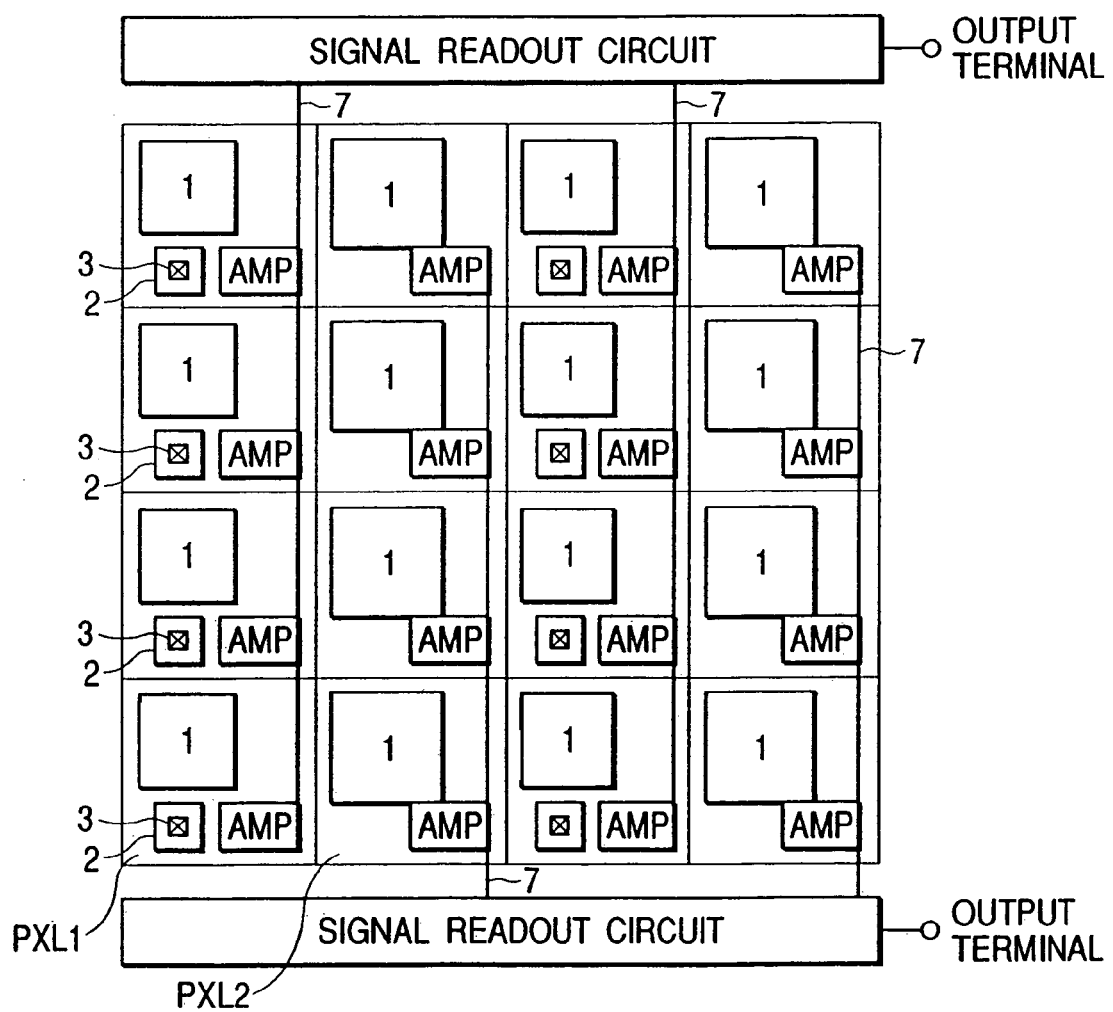
FIG. 11 is a schematically plan view of the solid-state imaging device according to the tenth embodiment of the present invention.

FIG. 11 is a plan view schematically showing the tenth embodiment of the present invention. Here, reference numeral 1 denotes a photodiode, reference numeral 2 a doped area, and reference numeral 3 a well contact. FIG. 11 shows 4×4 picture elements.

The doped area 2 is formed inside a common well. A control line for controlling a well wiring and a element is omitted. AMP denotes a semiconductor including a transistor for amplification.

Here, a column comprising first type picture elements PXL 1 each provided with the doped area 2 and the well contact 3 and a column comprising second type picture elements PXL 2 not provided with the doped area 2 and the well contact 3 are alternately arranged, and each output line 7 thereof is connected to a signal readout circuit in the upper part of FIG. 11 or in the lower part of FIG. 11.

The second type picture element PXL 2 becomes larger, in respect of the area (light-receiving area) of the semiconductor light-receiving region 1 which is cooperated with the common well to function as the photodiode, than the first type picture element PXL 1 by an area necessary for the doped area 2 and the well contact 3.

Since the areas of the photodiodes are different from each other, their sensitivities vary against incident light. Hence, it is preferable that, by controlling a gain in each readout circuit, output levels in the two output terminals are made to agree with each other when the same amount of light is entered.

In this embodiment, the well contacts are disposed at an interval of one column. However, the well contacts may be disposed at an interval of three or four columns or more.

Moreover, the well contacts may be also disposed in the vicinity of the picture element array area.

Eleventh Embodiment

Figure 12:
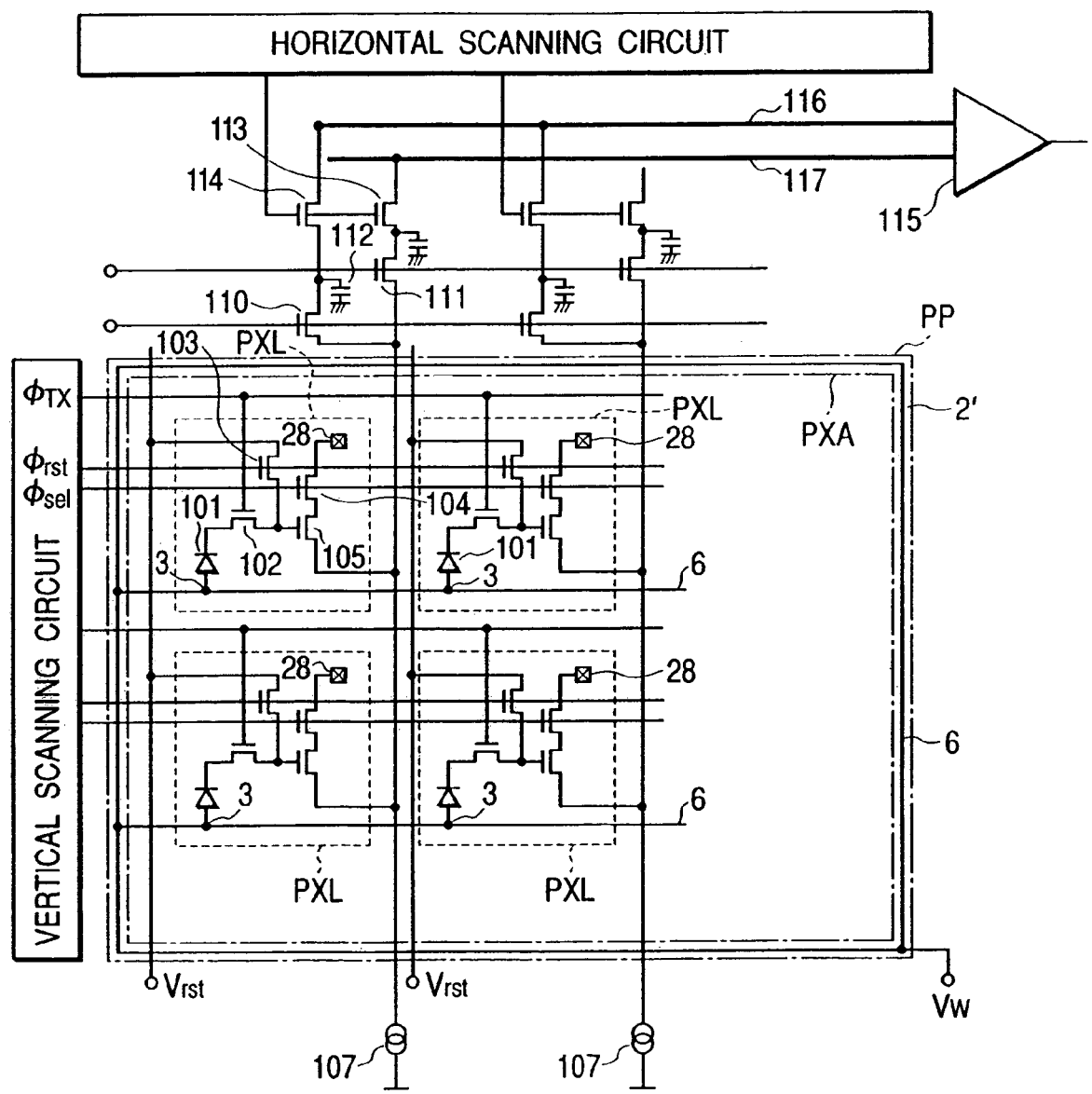
FIG. 12 is a circuit block diagram of the solid-state imaging device according to the eleventh embodiment of the present invention.

FIG. 12 is a circuit block diagram of the solid-state imaging device-according the eleventh embodiment of the present invention.

One PXL picture element includes a photodiode 101, a transfer switch 102, a reset transistor 103, a selection transistor 104, and an amplification transistor 105.

In each picture element PXL, the well contact 3 connected to a lateral well wiring 6 is disposed. Also, a power source contact 28 for supplying a power source voltage to the amplification transistor 105 is disposed in each picture element PXL.

In the inside of the picture element array area PXA, the large number of the above picture elements PXL are arranged two-dimensional matrix wise.

In the vicinity PP of the picture element array area PXA, the doped area 2' is disposed so as to surround the picture element array area, on which the well wiring 6 formed through the well contact is disposed.

Figure 16:
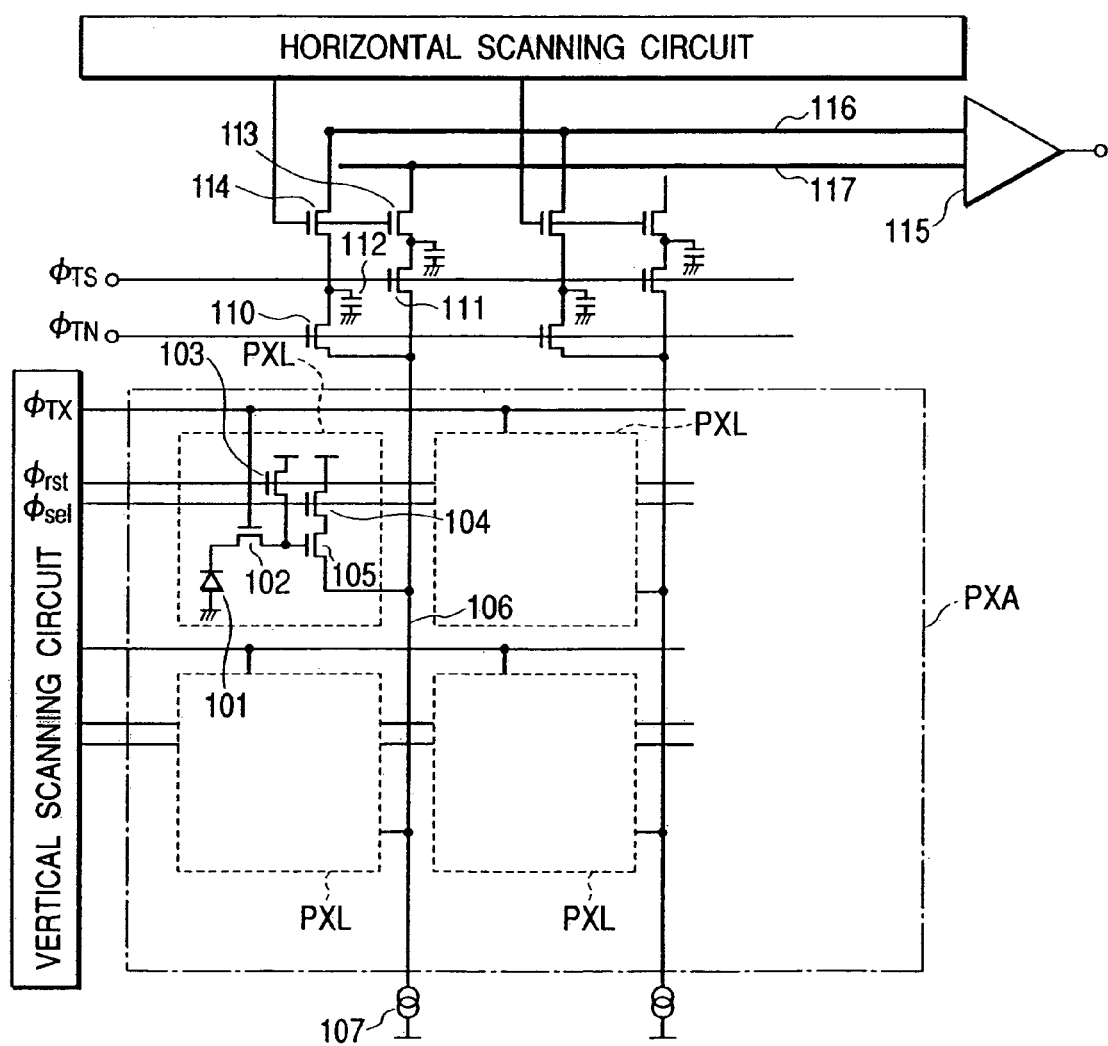
FIG. 16 is a circuit block diagram of a conventional solid-state imaging device.
Figure 17:
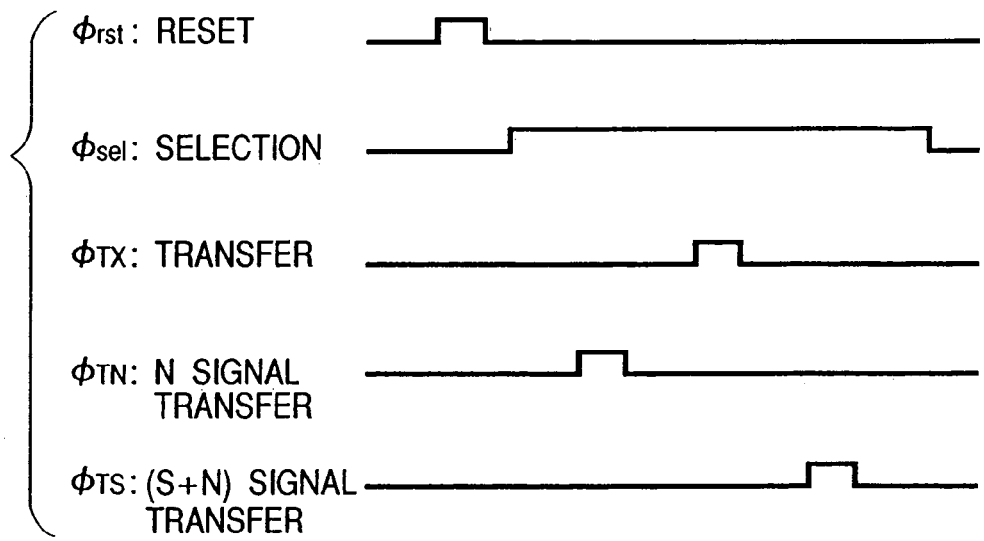
FIG. 17 is schematically sectional view showing the principal parts of the conventional solid-state imaging device.
Figure 18:
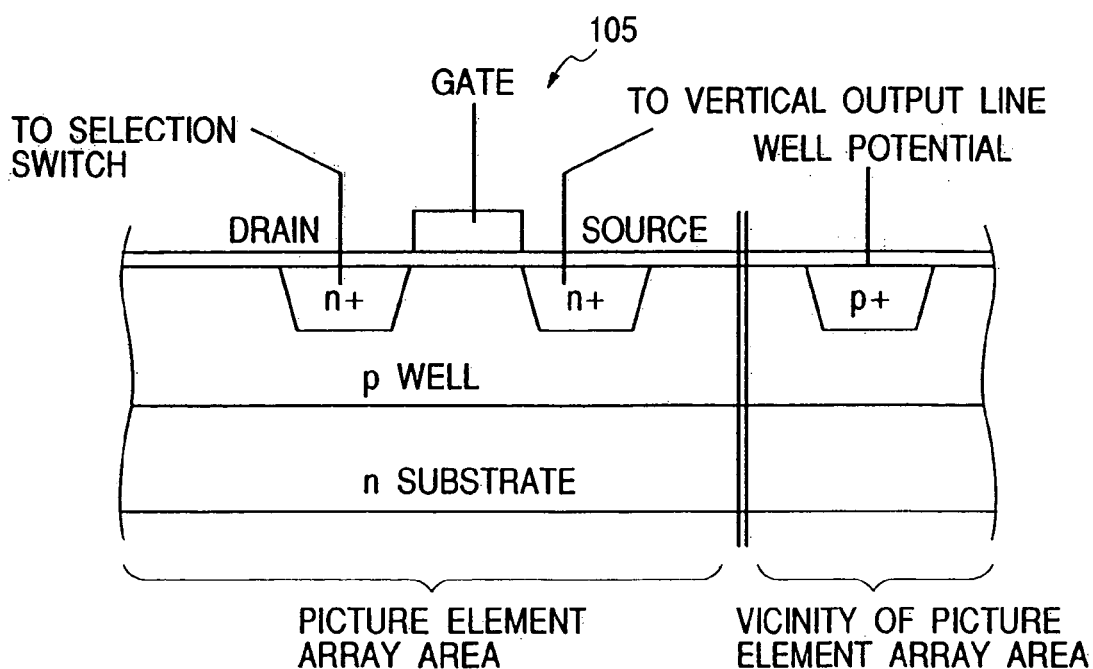
FIG. 18 is a timing chart for explaining the operation of the conventional solid-state imaging device.
Figure 20:
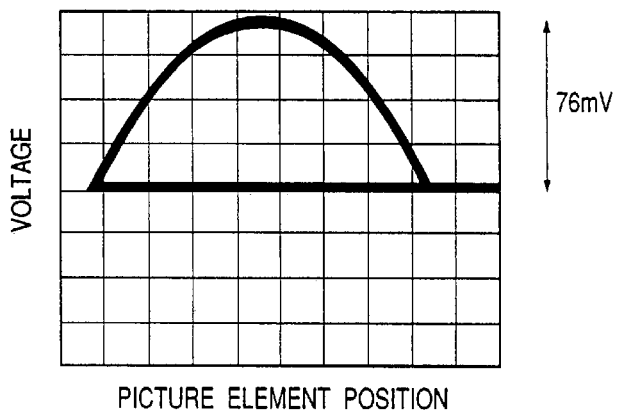
FIG. 20 is a graph showing a state of generation of the shading.
Figure 21:
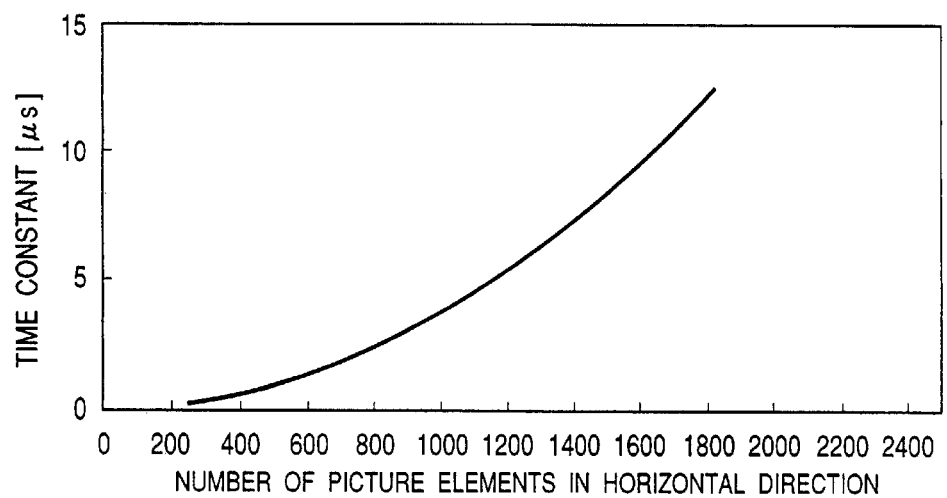
FIG. 21 is a graph showing a change in the time constant.

The driving method of this solid-state imaging device is the same as the driving method of the device as shown in FIGS. 16 and 17.

Figure 13:
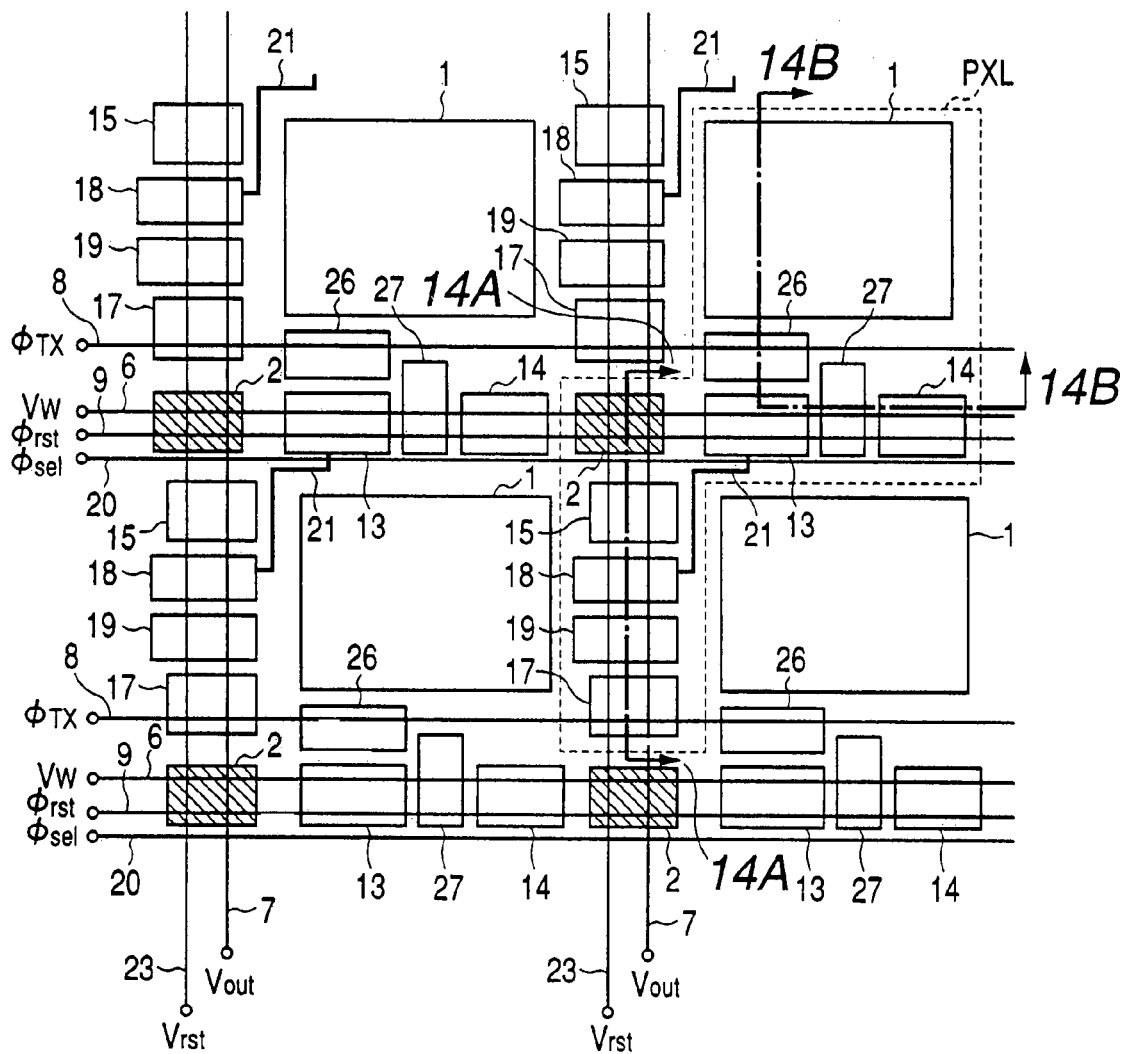
FIG. 13 is a circuit layout view of the solid-state imaging device according to the eleventh embodiment.

The outline of the circuit array (layout) of this solid-state imaging device is shown in FIG. 13. Also, the configuration corresponding to the section taken along the line 14A-14A of FIG. 13 is shown in FIG. 14A, and the configuration corresponding to the section taken along the line 14B-14B of FIG. 13 is shown in FIG. 14B.

With reference to FIG. 13, one picture element PXL, when seen a plan level, mainly comprises the portion (1, 13, 14, 26, 27) where a photodiode 101, a transfer switch 102 and a reset transistor 103 are disposed and the portion (15, 17, 18, 19) where a selection transistor 104 and a amplification transistor 105 are disposed, and the doped area 2 is further disposed between these two portions. The portion where the selection transistor 104 and the amplification transistor 105 are disposed is positioned between the photodiodes of the two picture elements of adjacent rows.

An output signal line 7 and a reset voltage line 23 giving a reset voltage Vrst are formed so as to extend in a column direction, and a transfer control line 8, a well wiring 6, a reset control line 9 and a selecting control line 20 are formed so as to extend in a row direction.

Figure 14A:
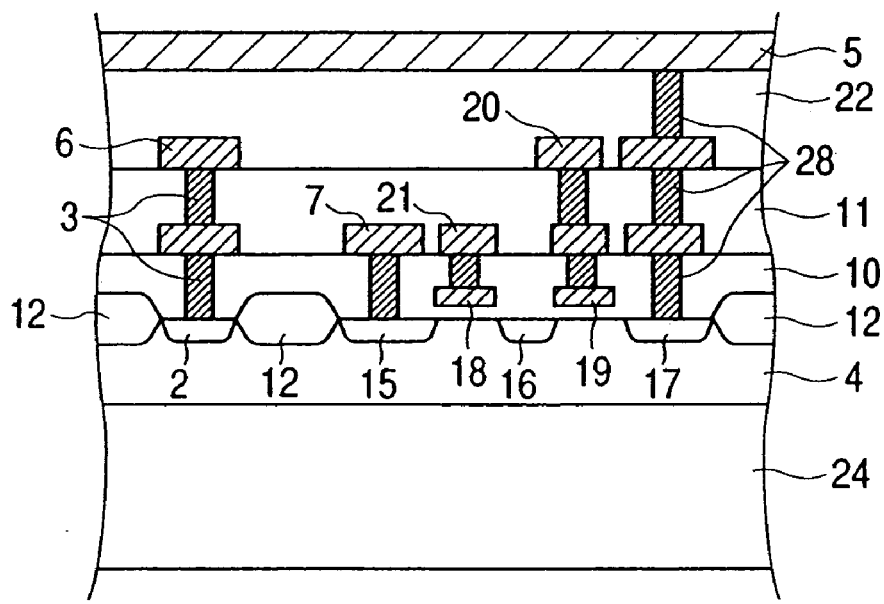
FIG. 14A is a schematically sectional view taken along the line 14A-14A of FIG. 13.
Figure 14B:
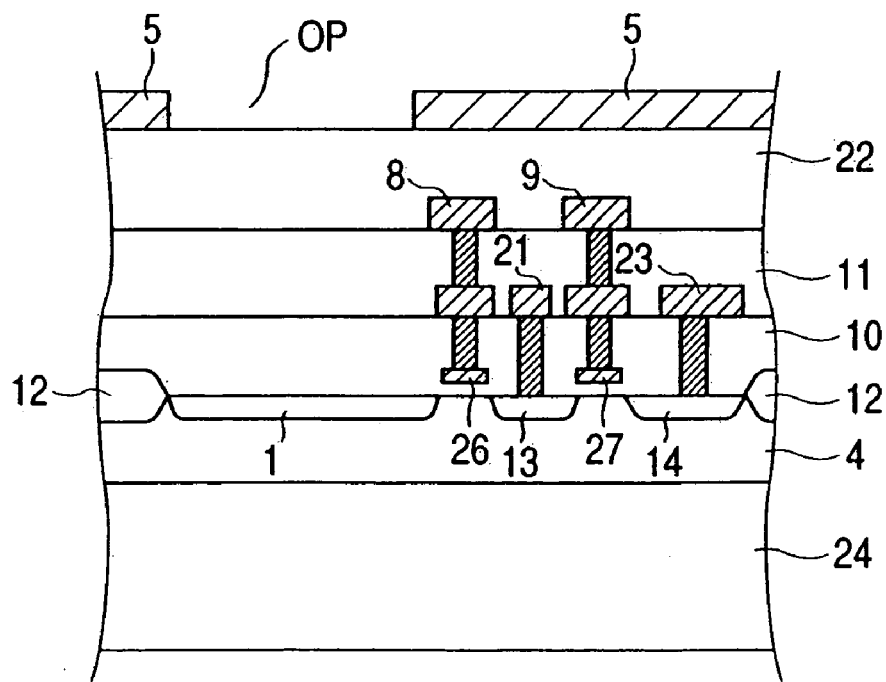
FIG. 14B is a schematically sectional view taken along the line 14B-14B of FIG. 13.

With reference to FIGS. 14A and 14B, a structure of the picture element will be described in detail.

As shown in FIG. 14B, in the inside of the area surrounded by an element separating area 12, a semiconductor light-receiving area 1 serving as a photodiode in cooperation with a common well 4, a semiconductor area 13 in a floating state and a semiconductor area 14 given a reset voltage are formed at a predetermined interval. A transfer gate 26 is connected to the transfer control line 8 comprising a second metal layer on a second insulating layer 11 through a plug inside the hole formed in a first insulating layer 10, a first metal layer between the first-insulating layer 10 and the second insulating layer 11 and a plug inside the hole formed in the second insulating layer 11.

A reset gate 27 is similarly connected to the reset control line 9 comprising the second metal layer on the second insulating layer 11 through a plug inside the hole formed in the first insulating layer 10, the first metal layer between the first insulating layer 10 and the second insulating layer 11 and a plug inside the hole formed in the second insulating layer 11.

The semiconductor area 14 is connected to a voltage line 23 comprising the first metal layer on the first insulating layer 11 through a plug inside the contact hole formed in the first insulating layer 10.

On the second metal layer, a third insulating layer 22 is formed, on which a shielding layer 5 composed of the third metal layer having a light-receiving window OP is formed.

As shown in FIG. 14A, in the area surrounded by the element separating area 12, a doped area 2, semiconductor areas 15, 16 and 17 serving as the sources and drains of the amplification transistor and the selection transistor are formed. In this embodiment, the element separating area 12 is also formed between the doped area 2 and the semiconductor area 15.

The doped area 2 is connected to the well contact 3 comprising the plug inside the hole formed in the first insulating layer 10, the first metal layer between the first insulating layer 10 and the second insulating layer 11, and the plug inside the hole formed in the second insulating layer 11. This well contact is connected to the well wiring 6 composed of the second metal layer on the second insulating layer 11.

The semiconductor area 15 is connected to the output line 7 composed of the first metal layer through the plug inside the hole formed in the first insulating layer 10.

A gate electrode 18 for the amplification transistor is connected to the semiconductor area 13 in a floating state through the plug inside the hole formed in the first insulating layer 10 and the wiring 21 composed of the first metal layer.

A gate electrode 19 for the selection transistor is connected to the selection control wire 20 through the plug inside the hole formed in the first insulating layer 10, the first metal layer between the first insulating layer 10 and the second insulating layer 11 and the plug inside the hole formed in the second insulating layer 11.

The semiconductor area 17 of the selection transistor is connected to a power source contact 28 comprising the plug inside the hole formed in the first insulating layer 10, the first metal layer between the insulating layers 10 and 11, the plug inside the hole formed in the second insulating layer 11, the second metal layer on the insulating layer 11, and the plug inside the hole formed in a third insulating layer 22. This power source contact 28 is connected to a shielding layer 5 composed of the third metal layer on the third insulating layer 22. By connecting this shielding film 5 to a power source voltage source VDD, the power source voltage is given to the semiconductor area 17.

Here, the semiconductor constituting a substrate 24 and each area 1, 13 to 17 is either a N type or an P type, and the semiconductor constituting the common well 4 and the doped area 2 is a reverse conductivity type with respect to the above semiconductor.

Each area from 13 to 17 may be preferably changed to a LDD structure including an area with a low impurity concentration.

Also, on the surface of each gate electrode 18, 19, 26 and 27 and the surface of each area 2 and 13 to 17, a metal silicide such as cobalt silicide may be formed.

The plug inside the hole constituting the well contact 3 and the power contact 28 is formed from a metal or an alloy, such as tungsten, aluminum, aluminum-copper, and copper. Moreover, a barrier metal such as titanium nitride may be formed on the upper and the lower surfaces or at the side of the plug.

The first to the third metal layers serving as each control line, the voltage line, the well wiring and the shielding layers are also formed from a metal or an alloy, such as aluminum, aluminum-copper, and copper. Moreover, a barrier metal such as titanium nitride may be formed on the upper and the lower surfaces or at the side thereof.

Twelfth Embodiment

Figure 15:
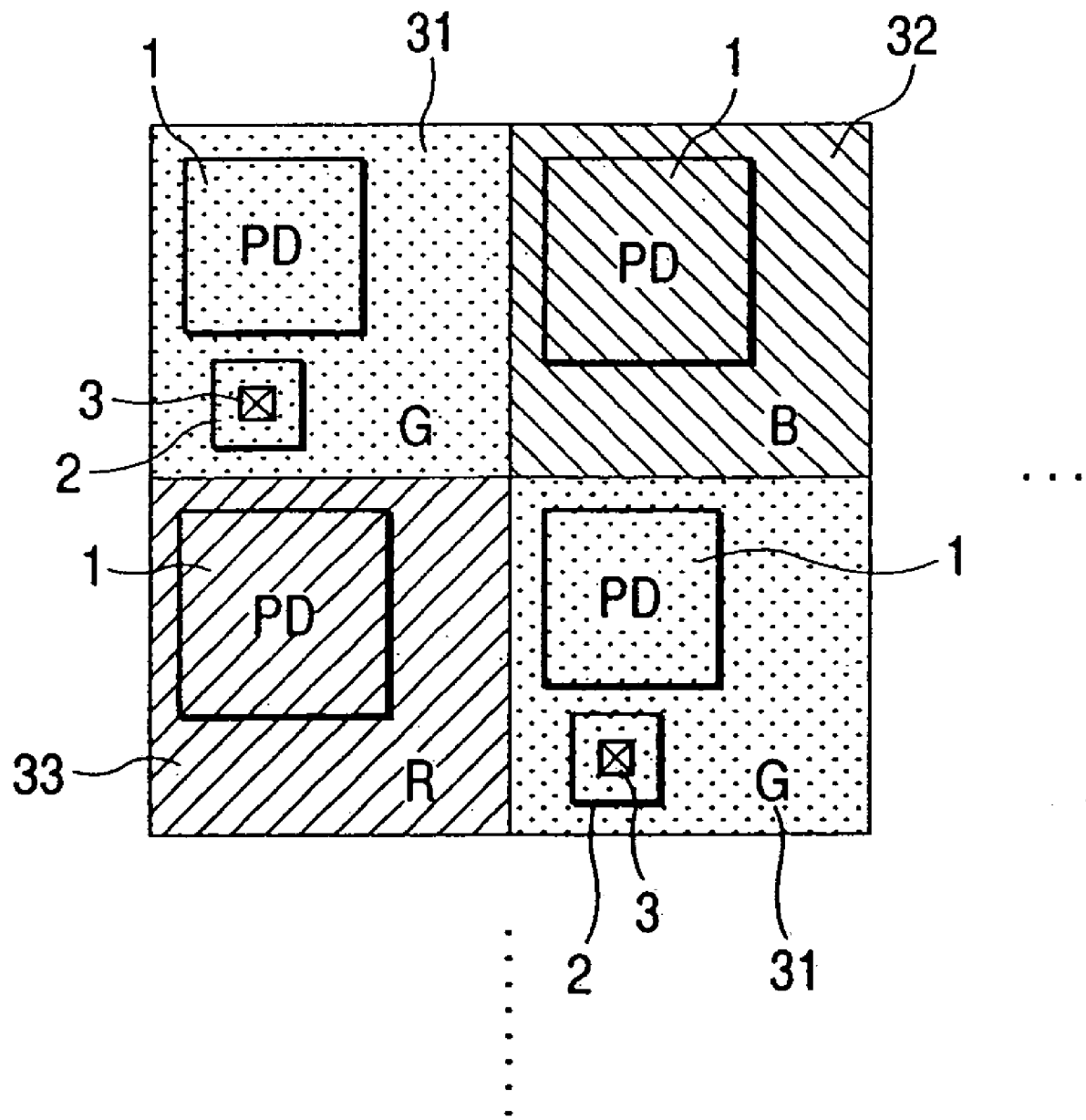
FIG. 15 is a schematically top view of the solid-state imaging device according to the twelfth embodiment of the present invention.

FIG. 15 is a top view of the solid-state imaging device according to the twelfth embodiment of the present invention.

Here, 2×2 picture elements are illustrated. However, in reality, these four picture elements are repeatedly arranged two-dimensionally.

The feature of this embodiment is that, in a color solid-state imaging device capable of obtaining a plurality of color signals similar to the solid-state imaging device having an elementary color filter or the solid-state imaging device having a complementary color filter, the well contact is disposed only in the same color picture elements with the largest number.

Reference numeral 31 is a G picture element where a colored layer of green (G) of a color filter is disposed, reference numeral 32 a B picture element where a colored layer of blue (B) of the color filter is disposed and reference numeral 33 a R picture element where a colored layer of red (R) of the color filter is disposed.

The colored layer is disposed on the light-receiving window of the shielding film directly or through a transparent layer.

Here, only in each of the G picture elements 31 on the diagonal of the 2×2 picture element array, the doped area 2 and the well contact 3 are disposed. In the B picture element 32 and the R picture element 33, the doped area and the well contact are not disposed, but is made larger, in the light-receiving area of the semiconductor light-receiving region 1 of the photodiode, in comparison with the G picture element, thereby enhancing a sensitivity. The G picture element is smaller in light-receiving area per one picture element than the picture elements of other colors, but the G picture elements are arranged so as to become about two times the number of each of the picture elements of other colors.

In the picture elements of the same color, since the light-receiving area per each one picture element is entirely the same, the control of a white balance and the like is quite easy in image processing by adjusting the level of each color signal.

The output signal of each color signal may be outputted by alternately distributing upward and downward for each column as shown in FIG. 11 or may be outputted only upward (or downward) as shown in FIG. 12.

Thirteenth Embodiment

In this embodiment, the solid-state imaging device is configured such that a color filter having an array pattern of colored layers as shown in FIG. 15 is mounted on the shielding layer of the solid-state imaging device as shown in FIGS. 12, 13, 14A and 14B.

The well contacts 2 are formed in all the picture elements as shown in FIG. 13. The light-receiving area of each picture element may be the same in all the picture elements or may be different in each color or may be as shown in FIG. 15 or may be whichever it is. A choice may be made in considering respective features. The light-receiving area can be determined by the area of the light-receiving window of the shielding layer.

Also, the picture elements in the picture element array area adjacent to the vicinity PP of the picture element array area, the shielding film is not provided with the light-receiving window, but can be operated as the so-called shielding picture element (optical black). In this case, by also disposing the well contact similarly to the case of the color picture element, the reference level at a dark time can be adjusted between the color picture element and the shielding picture element.

Fourteenth Embodiment

In the color solid-state imaging device, the well contact may be disposed only in the R picture element or the B picture element.

As described above, according to the present invention, by disposing a plurality of well contacts inside the picture element array area, the non-uniform distribution of the well potential can be inhibited, whereby the shading can be reduced.

What is claimed is:

1. A solid-state imaging device of an amplification type, comprising a plurality of picture elements arranged two-dimensionally in a picture-element array area and disposed in a common well, each picture element including a photoelectric conversion element and a transistor for amplification, wherein a semiconductor light-receiving region of a first conductivity type included in each photoelectric conversion element is disposed in the common well, which is composed of a semiconductor of a second conductivity type formed in a semiconductor substrate of the first conductivity type, wherein contacts for supplying a reference voltage to the common well are disposed within the picture-element array area, wherein, for each transistor for amplification, a semiconductor region of the first conductivity type serving as a source or a drain is disposed in the common well, and a gate is arranged to receive an output from the light-receiving region, and wherein, for each picture element, a contact for a power source is disposed for supplying a power-source voltage for driving the transistor for amplification, one of the contacts for supplying the reference voltage and the contact for the power source are connected to a wiring arranged at predetermined intervals in the picture-element array area and another of the contacts for supplying the reference voltage and the contact for the power source are connected to a shielding layer having a light-receiving window formed above the wiring, and the wiring is disposed between two control lines for controlling a semiconductor element included in the picture element and in a layer level lower than that of the shielding layer.

2. The solid-state imaging device according to claim 1, wherein at least one of the plurality of picture elements further includes a transfer gate, a reset transistor, and a selection transistor, and wherein the two control lines are selected from a group consisting of a control line of the transfer gate, a control line of the reset transistor, and a control line of the selection transistor.

3. A solid-state imaging device of an amplification type, comprising a plurality of picture elements arranged two-dimensionally in a picture-element array area and disposed in a common well, each picture element including a photoelectric conversion element and a transistor for amplification, wherein a semiconductor light-receiving region of a first conductivity type included in each photoelectric conversion element is disposed in the common well, which is composed of a semiconductor of a second conductivity type formed in a semiconductor substrate of the first conductivity type, wherein contacts for supplying a reference voltage to the common well are disposed within the picture-element array area, wherein, for each transistor for amplification, a semiconductor region of the first conductivity type serving as a source or a drain is disposed in the common well, and a gate is arranged to receive an output from the light-receiving region, and wherein, for each picture element, a contact for a power source is disposed for supplying a power-source voltage for driving the transistor for amplification, the contacts for supplying the reference voltage are connected to wiring for supplying the reference voltage arranged inside the picture-element array area at predetermined intervals and the contact for the power source is connected to a shielding layer having a light-receiving window formed above the wiring for supplying the reference voltage, and the wiring for supplying the reference voltage is disposed between two control lines for controlling a semiconductor element in the picture element and in a layer level lower than that of the shielding layer.

4. A solid-state imaging device of the amplification type, comprising a plurality of picture elements arranged two-dimensionally in a picture-element array area and disposed in a common well, each picture element including a photoelectric conversion element and a transistor for amplification, wherein a semiconductor light-receiving region of a first conductivity type included in each photoelectric conversion element is disposed in the common well, which is composed of a semiconductor of a second conductivity type formed in a semiconductor substrate of the first conductivity type, wherein contacts for supplying a reference voltage to the common well are disposed within the picture-element array area, wherein, for each transistor for amplification, a semiconductor region of the first conductivity type serving as a source or a drain is disposed in the common well, and a gate is arranged to receive an output from the light-receiving region, wherein, for each picture element, a contact for a power source is disposed for supplying a power-source voltage for driving the transistor for amplification, wherein at least one of the plurality of picture elements further includes a reset transistor, wherein, for each of the at least one of the plurality of picture elements that includes a reset transistor, a reset contact is disposed for supplying a reset reference voltage to the reset transistor, and wherein, for each of the at least one of the plurality of picture elements that includes a reset transistor, any two of the contacts for supplying the reference voltage, the reset contact, and the contact for the power source are connected to intersecting wirings arranged in the picture-element array area, and a remaining one of the contacts for supplying the reference voltage, the reset contact, and the contact for the power source is connected to a shielding film having a light-receiving window formed above the wirings, which are disposed in a layer level lower than that of the shielding film.

* * * * *